(12) United States Patent
Hu et al.

(10) Patent No.: US 11,195,958 B2
(45) Date of Patent: Dec. 7, 2021

(54) SEMICONDUCTOR DEVICE WITH DEEP TRENCH ISOLATION AND TRENCH CAPACITOR

(71) Applicant: TEXAS INSTRUMENTS INCORPORATED, Dallas, TX (US)

(72) Inventors: Binghua Hu, Plano, TX (US); Alexei Sadovnikov, Sunnyvale, CA (US); Abbas Ali, Plano, TX (US); Yanbiao Pan, Plano, TX (US); Stefan Herzer, Marzling (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/023,639

(22) Filed: Sep. 17, 2020

(65) Prior Publication Data

US 2021/0005760 A1 Jan. 7, 2021

Related U.S. Application Data

(62) Division of application No. 16/232,322, filed on Dec. 26, 2018, now Pat. No. 10,811,543.

(51) Int. Cl.
*H01L 29/66* (2006.01)
*H01L 29/94* (2006.01)
(Continued)

(52) U.S. Cl.
CPC .... *H01L 29/945* (2013.01); *H01L 21/823814* (2013.01); *H01L 29/0653* (2013.01);
(Continued)

(58) Field of Classification Search
CPC . H01L 21/02; H01L 21/0223; H01L 21/3205; H01L 21/762; H01L 21/265; H01L 21/306; H01L 21/32055; H01L 21/76224; H01L 21/30625; H01L 21/26513; H01L 21/823814; H01L 21/027; H01L 21/76; H01L 21/266; H01L 21/8234; H01L 21/0271; H01L 21/0274; H01L 21/02694; H01L 21/823493; H01L 29/945; H01L 29/0653; H01L 29/0847; H01L 29/42368; H01L 29/66712; H01L 29/06; H01L 29/08; H01L 29/10; H01L 29/66;
(Continued)

(56) References Cited

U.S. PATENT DOCUMENTS 5,843,820 A 12/1998 Lu
6,236,079 B1 5/2001 Nitayama et al.
(Continued)

FOREIGN PATENT DOCUMENTS

DE 10 2012 209 192 A1 12/2012

*Primary Examiner* — Chuong A Luu
(74) *Attorney, Agent, or Firm* — Jacqueline J. Garner; Charles A. Brill; Frank D. Cimino

(57) ABSTRACT

A semiconductor device with an isolation structure and a trench capacitor, each formed using a single resist mask for etching corresponding first and second trenches of different widths and different depths, with dielectric liners formed on the trench sidewalls and polysilicon filling the trenches and deep doped regions surrounding the trenches, including conductive features of a metallization structure that connect the polysilicon of the isolation structure trench to the deep doped region to form an isolation structure.

17 Claims, 18 Drawing Sheets

(51) Int. Cl.
*H01L 29/08* (2006.01)
*H01L 21/8238* (2006.01)
*H01L 29/06* (2006.01)
*H01L 29/423* (2006.01)

(52) U.S. Cl.
CPC .... *H01L 29/0847* (2013.01); *H01L 29/42368* (2013.01); *H01L 29/66712* (2013.01)

(58) Field of Classification Search
CPC ... H01L 29/94; H01L 29/423; H01L 29/1083; H01L 27/06; H01L 27/0629; H01L 21/8238
USPC .......................................................... 257/306
See application file for complete search history.

(56) References Cited

U.S. PATENT DOCUMENTS

| | | |
|---|---|---|
| 7,732,863 B2 | 6/2010 | Pendharkar et al. |
| 7,745,294 B2 | 6/2010 | Pendharkar et al. |
| 7,772,075 B2 | 8/2010 | Pendharkar et al. |
| 7,772,644 B2 | 8/2010 | Pendharkar et al. |
| 7,829,430 B2 | 11/2010 | Pendharker et al. |
| 8,154,101 B2 | 4/2012 | Pendharkar et al. |
| 8,309,423 B2 | 11/2012 | Pendharkar et al. |
| 9,337,106 B2 | 5/2016 | Pendharkar et al. |
| 9,633,849 B2 | 4/2017 | Pendharkar et al. |
| 10,811,543 B2 * | 10/2020 | Hu ..................... H01L 29/0847 |
| 2006/0211196 A1 | 9/2006 | Tanaka et al. |
| 2009/0283827 A1 | 11/2009 | Pendharkar et al. |
| 2009/0286371 A1 | 11/2009 | Pendharkar et al. |
| 2009/0294841 A1 | 12/2009 | Pendharkar et al. |
| 2010/0032794 A1 | 2/2010 | Pendharkar et al. |
| 2012/0012971 A1 | 1/2012 | Kwon et al. |
| 2012/0164814 A1 | 6/2012 | Pendharkar et al. |
| 2013/0320443 A1 | 12/2013 | Levin et al. |
| 2015/0187658 A1 | 7/2015 | Pendharkar et al. |
| 2016/0225672 A1 | 8/2016 | Pendharkar et al. |
| 2018/0076277 A1 | 3/2018 | Hu et al. |
| 2018/0130869 A1 | 5/2018 | Hu et al. |

* cited by examiner

SEMICONDUCTOR DEVICE WITH DEEP TRENCH ISOLATION AND TRENCH CAPACITOR

CROSS-REFERENCE TO RELATED APPLICATIONS

This application is a division of U.S. application Ser. No. 16/232,322 filed Dec. 26, 2018, the contents of which are herein incorporated by reference in its entirety.

FIELD

This disclosure relates to semiconductor devices with isolation structures and capacitors.

BACKGROUND

Isolation structures are used in integrated circuits to provide an electrically isolated active region for one or more transistors or other circuit components, and allow the use of different power supply domains on a single IC (e.g., high and low voltage circuits). One form of isolation structures is deep trench isolation. Deep trenches are also used to form trench capacitors in integrated circuits. Conventional semiconductor device fabrication processes separately manufacture trench isolation and trench capacitors, requiring separate masking and other process steps, and increasing cost and process complexity.

SUMMARY

This summary is provided to introduce a brief selection of disclosed concepts in a simplified form that are further illustrated and described below. This summary is not intended to limit the scope of the claimed subject matter. Disclosed aspects include semiconductor devices and fabrication methods therefor. An example semiconductor device includes an isolation structure and a trench capacitor formed using a single resist mask for etching corresponding first and second trenches. In one example, the trenches include dielectric liners formed on the trench sidewalls, and are filled with polysilicon. Deep doped regions extend around the trenches. In one example, the trenches and the deep doped regions extend from a semiconductor surface layer to a buried layer of a semiconductor structure. Conductive features of a metallization structure connect the polysilicon of the isolation trench to the deep doped region to form an isolation structure. Second conductive features of the metallization structure connect to the polysilicon of the capacitor trench to form a first capacitor plate, and further conductive features of the metallization structure are connected to the deep doped region around the capacitor trench to form a second capacitor plate. In one example, the isolation trench width is different from the capacitor trench width. In one example, the isolation and capacitor trenches have different depths. In one example, the trenches include multilayer dielectric liners, such as oxide, nitride and oxide (ONO) sublayers. In one example, capacitor includes multiple trenches surrounded by the second deep doped region and individually including a corresponding dielectric sidewall liner and polysilicon fill. In certain example, the trench polysilicon is doped. One example also includes a shallow implant region that extends in the semiconductor surface layer along a side of the isolation trench within the deep doped region.

A method is disclosed for fabricating an isolation structure in a semiconductor device. An example method includes forming a trench in a semiconductor structure forming a deep doped region surrounding the trench, forming a dielectric on a sidewall of the trench, filling the trench with polysilicon, and forming conductive features of a metallization structure that connect the polysilicon to the deep doped region to form an isolation structure. In one example, the dielectric is formed as a multi-layer dielectric liner by depositing a first oxide layer on the sidewall of the trench, depositing a nitride layer on the first oxide layer, and depositing a second oxide layer on the nitride layer. In one example, the method further includes forming a shallow implant region along a side of the trench within the deep doped region.

A disclosed method of fabricating a semiconductor device includes forming a resist layer with a first opening and a second opening on a top surface of a semiconductor structure, etching through the first opening to form a first trench and etching through the second opening to form a second trench, and implanting dopants through the first opening to form a first deep doped region surrounding the first trench and through the second opening to form a second deep doped region surrounding the second trench. The method further includes depositing a first dielectric liner through the first opening and through the second opening, and depositing polysilicon through the first and second openings to fill the trenches. The method further includes forming first conductive features of a metallization structure that connect the first polysilicon to the first deep doped region to form an isolation structure, as well as forming second conductive features of the metallization structure that connect to the second polysilicon to form a first capacitor plate, and forming further conductive features of the metallization structure that connect to the second deep doped region to form a second capacitor plate. In one example, the resist layer formation includes patterning the first opening with a first width, and patterning the second opening with a smaller second width. In this example, the first trench has a larger depth than the second trench. In one example, the dielectric liners are formed as multi-layer structures by performing deposition processes through the mask openings that deposit a first oxide layer on the sidewalls of the trenches, deposit a nitride layer on the first oxide layer, and deposit (or grow oxide on nitride to form oxynitride) a second oxide layer on the nitride layer. In one example, the method further includes forming a shallow implant region along a side of the trench within the deep doped region before an ONO deposition.

DETAILED DESCRIPTION

Figure 1:
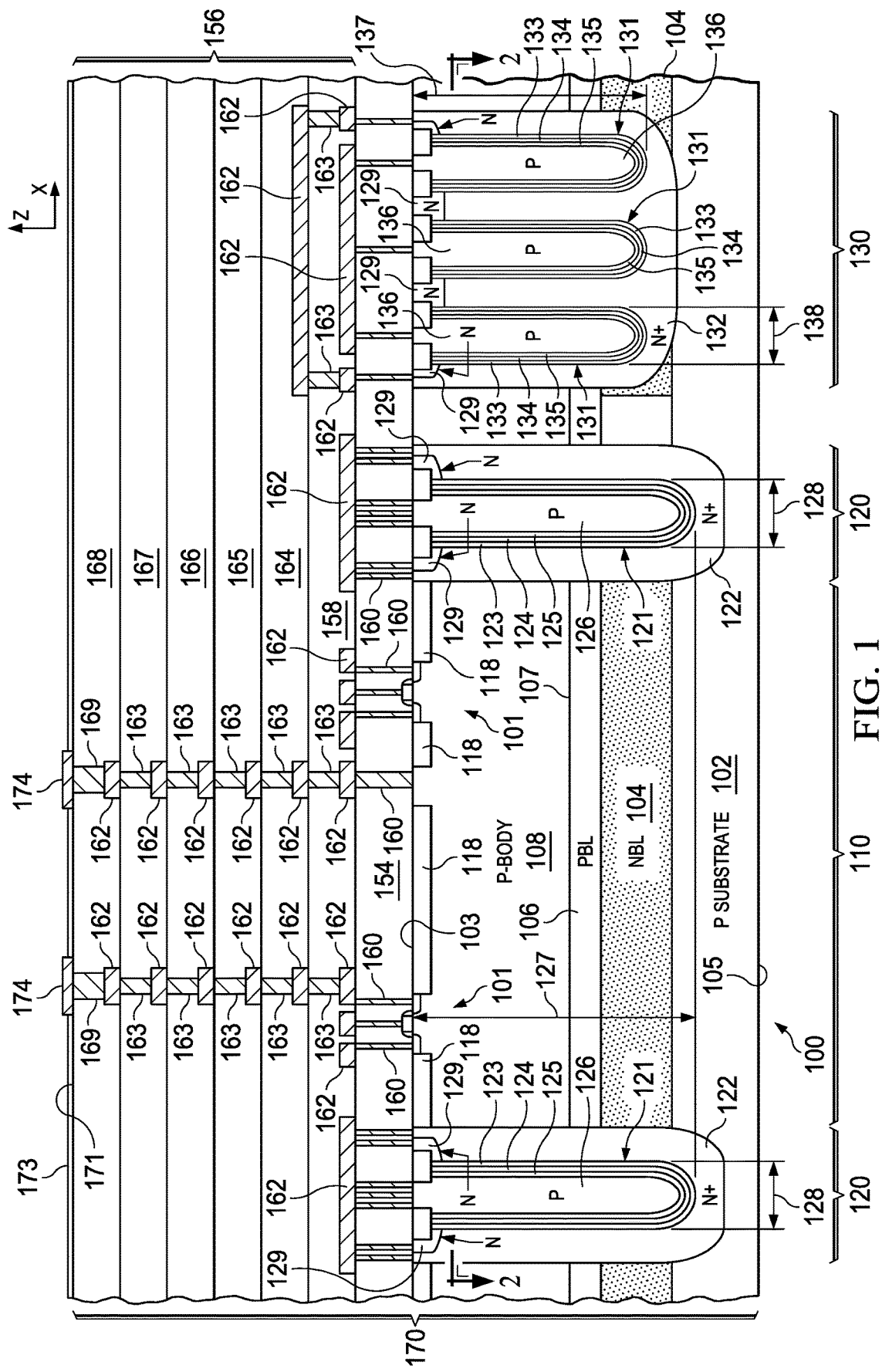
FIG. 1 is a partial sectional side elevation view of an integrated circuit semiconductor device that includes deep trench isolation structures and trench capacitors.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections. The various features of the disclosed examples can be used in connection with a variety of different semiconductor devices, including without limitation integrated circuits having multiple electronic components, as well as single component semiconductor devices (e.g., single transistor products, single diode products, etc.).

Example devices and fabrication methods provide process integration for both trench isolation and high density trench capacitors fabricated using a shared resist mask to economize fabrication time and costs. In some examples, the trenches are etched, deep doped regions surrounding the trenches are implanted, and the trenches are lined and filled using a thick photoresist and hard mask patterned with openings for capacitor trenches and wider openings for isolation structure trenches. Described examples provide metallization layout structures to provide first and second capacitor plates for capacitor trench structures, and connected polysilicon and deep doped regions for isolation trench structures. Described examples facilitate forming deep trench isolation features as well as high density trench capacitor with one mask, and with reduced isolation (e.g., deep n region) to isolation spacing using self-aligned deep doped region implantation on deep trench sidewalls.

Figure 2:
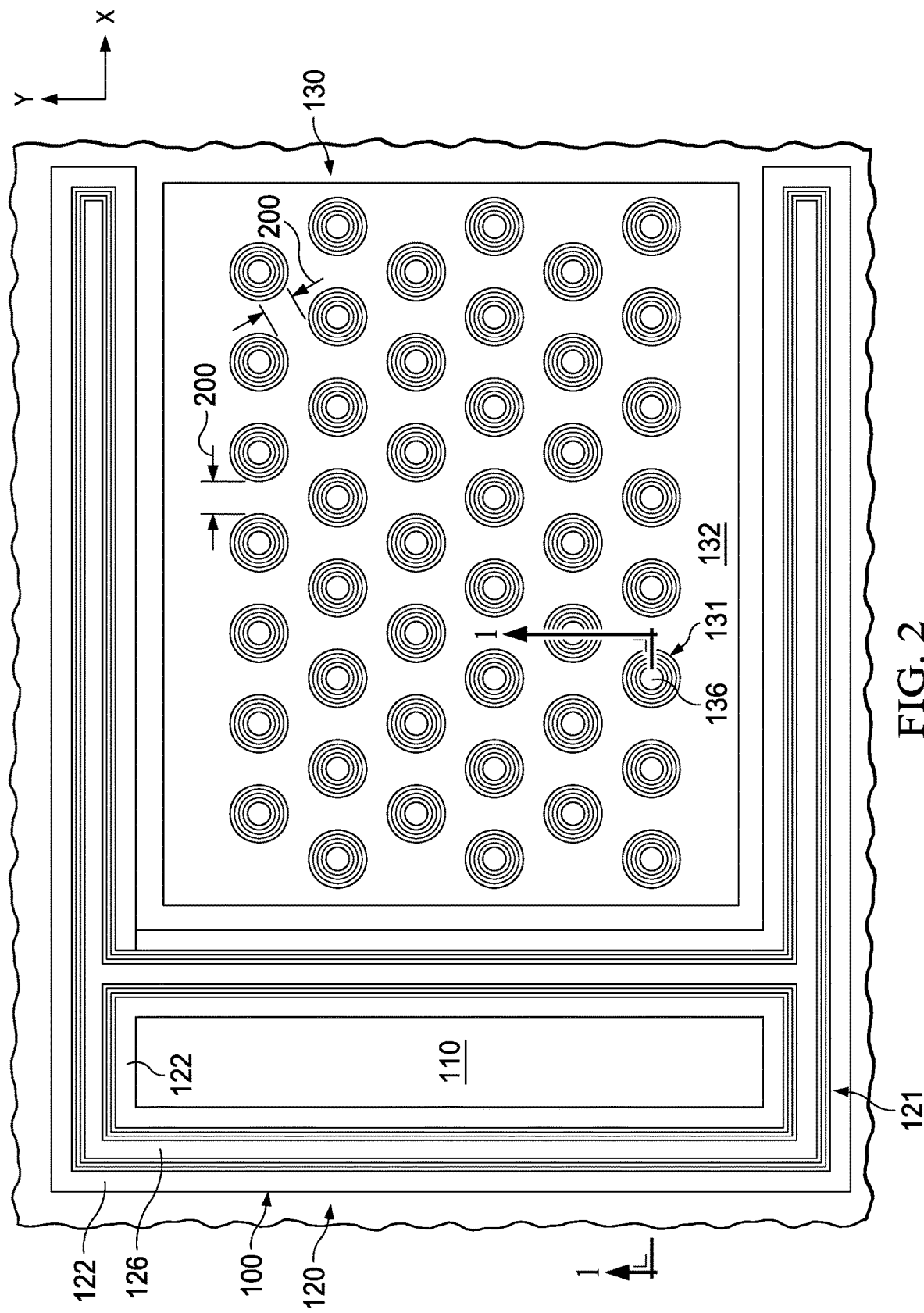
FIG. 2 is a top plan view of a portion of the semiconductor device of FIG. 1.

FIGS. 1 and 2 show an example integrated circuit semiconductor device 100 that includes two metal oxide semiconductor (MOS) transistors 101. Disclosed examples can also include stand-alone discrete transistor semiconductor devices that have a single transistor. The transistors 101 in FIG. 1 have single gate, source and drain finger structures. In other implementations, transistors can be built with multiple finger structures surrounding a center finger, such as source-centered configurations, drain-centered configurations, etc. The deep trench isolation and trench capacitor concepts of the present disclosure can be implemented in combination with any type or form of transistor, such as MOS transistors bipolar transistors, etc. In addition, various aspects of the disclosure can be used in combination with drain extended MOS transistors (not shown). Described examples include doped regions of various semiconductor structures which may be characterized as p-doped and/or n-doped regions or portions, and include regions that have majority carrier dopants of a particular type, such as n-type dopants or p-type dopants.

The transistors 101 are fabricated on and/or in a semiconductor substrate 102. The semiconductor substrate 102 in one example is a silicon wafer, a silicon-on-insulator (SOI) substrate or other semiconductor structure. In one example, the substrate 102 is a p-doped silicon substrate or wafer, with a first (e.g., top) side 103, various buried layers 104, 106 formed therein, and a second (e.g., bottom) side 105. In another possible implementation, the substrate 102 includes one or more epitaxial silicon layers (not shown) formed on a top surface, with one or more of the buried layers 104, 106 formed in epitaxial layers of the substrate. In the illustrated example, the substrate 102, the buried layers 104 and 106, and an upper semiconductor surface layer (e.g., body region 108) constitute a semiconductor structure. The example semiconductor structure includes a first doped layer 106 that includes p-type majority carrier dopants. In one implementation, the p-type layer includes a portion implanted with boron to form a p-type buried layer (PBL) with an upper or top side 107. The semiconductor surface layer 108 extends over (e.g., directly on) the p-type buried layer 106 and includes the upper side 103 of the semiconductor structure. The example layer 104 (e.g., an n-type buried layer or NBL) includes n-type majority carrier dopants. The NBL 104 extends along the vertical Z direction from beneath the PBL 106 toward the second side 105. In one example, a first epitaxial silicon layer is formed over the upper surface of a silicon wafer substrate 102, and all or a portion of the first epitaxial layer is implanted with n-type dopants (e.g., phosphorus, etc.) to form the NBL 104. In this example, a second epitaxial silicon layer is formed over the first epitaxial layer, and all or a portion of the second epitaxial layer is implanted with p-type dopants (e.g., boron, etc.) to form the p-type buried layer 106 with the upper side 107. In one example, the PBL region 106 is formed using ion implantation through the first EPI surface. The example surface layer 108 has p-type majority carrier dopants and extends downward along the Z direction from the first side 103.

The transistors 101 are formed on or in the semiconductor surface layer 108 within an active region 110 of the semiconductor structure 102, 104, 106, 108. The example semiconductor surface layer 108 includes p-type majority carrier dopants. The illustrated device 100 includes an outer oxide isolation structure 118 that encircles the transistor 101 along the first (e.g., top) side 103 in the semiconductor surface layer 108. The oxide structure 118 in one example is a shallow trench isolation (STI) structure, which is disposed laterally outward of the transistors 101. In the illustrated example, the STI structure 118 defines an end of the active region 110 of the semiconductor substrate 102 in which the transistors 101 are formed.

The illustrated device 100 includes a trench-based isolation structure 120, referred to as a deep trench isolation structure. The deep trench isolation structure 120 in FIG. 1 is adjacent to the STI structure 118, and laterally encircles or surrounds the transistors 101 and the active region 110 of the semiconductor structure. The isolation structure 120 includes a first trench 121 that extends downward from the first side 103 through the semiconductor structure 102, 104, 106, 108 to the buried layer 104. The isolation structure 120 also includes a first deep doped region 122 with n-type majority carrier dopants (e.g., phosphorus). The first deep doped region 122 surrounds the first trench 121 and extends from the semiconductor surface layer 108 to the buried layer 104.

The isolation structure 120 also includes a first dielectric liner that extends along the sidewall of the first trench 121 from the semiconductor surface layer 108 to the buried layer 104. Any single or multilayer dielectric liner can be used. In one example, the first dielectric liner includes a first oxide layer 123, a nitride layer 124, and a second oxide layer 125. The first oxide layer 123 (e.g., silicon dioxide or $SiO_2$) extends along the sidewall of the first trench 121 from the semiconductor surface layer 108 to the buried layer 104. The nitride layer 124 (e.g., silicon nitride or silicon oxynitride) extends along the first oxide layer 123 from the semiconductor surface layer 108 to the buried layer 104. The second oxide layer 125 (e.g., silicon dioxide or $SiO_2$) extends along the nitride layer 124 from the semiconductor surface layer 108 to the buried layer 104.

The isolation structure 120 also includes a first polysilicon 126 that extends inside the first dielectric liner 123, 124, 125. The first polysilicon 126 fills the first trench 121 to the top side 103 of the semiconductor surface layer 108. The first polysilicon 126 in one example includes p-type majority carrier dopants (e.g., boron). In the example of FIGS. 1 and 2, the deep trench isolation structure 120 is formed as a ring structure that laterally surrounds the transistors 101. As shown in FIG. 1, the first trench 121 has a first depth 127 and a first width 128. The semiconductor device 100 also includes shallow implant regions 129 with n-type majority carrier dopants (e.g., a shallow n-well implanted with phosphorus). The shallow implant regions 129 extend in the semiconductor surface layer 108 along a side of the first trench 121 within the first deep doped region 122. In one example, the shallow implant is also used to form lower case n-type source/drain features (not shown) of transistors in the device 100.

The illustrated device 100 also includes one or more trench-based capacitors. In one example, the trench capacitor 130 can be constructed using a single trench. In the example of FIGS. 1 and 2, the capacitor 130 includes multiple second trenches 131 that individually extend through the semiconductor structure 102, 104, 106, 108 to the buried layer 104. Each of the second trenches 131 is surrounded by a second deep doped region 132. FIG. 1 shows three trenches 131 that extend from the first side 103 through the semiconductor structure to the buried layer 104. The second trench 131 has a second depth 137 and a second width 138. The first width 128 of the first (isolation) trench 121 is greater than the second (capacitor trench) width 138 in the device of FIGS. 1 and 2. The first width 128 of the first trench 121 is greater than the second width 138 of the capacitor trenches 131. In one example, the first width 128 of the first trench 121 is approximately 1.5 μm, for example, from 1.35 μm to 1.65 μm, and the second width 138 of the capacitor trenches 131 is approximately 1.2 μm, for example, from 1.05 μm to 1.35 μm.

The example capacitor 130 further includes second dielectric liners (e.g., layers 133, 134, and 135) in each of the trenches 131. The second dielectric liners extend along sidewalls of the second trenches 131 from the semiconductor surface layer 108 to the buried layer 104. The example second dielectric liner is a multi-layer structure with a third oxide layer 133 that extends along the sidewall of the second trench 131 from the semiconductor surface layer 108 to the buried layer 104. The example second dielectric liner also includes a second nitride layer 134 that extends along the third oxide layer 133 from the semiconductor surface layer 108 to the buried layer 104, and a fourth oxide layer 135 that extends along the second nitride layer 134 from the semiconductor surface layer 108 to the buried layer 104.

The capacitor 130 also includes a second deep doped region 132 implanted with n-type majority carrier dopants (e.g., phosphorus). The second deep doped region 132 surrounds the second trenches 131 and extends from the semiconductor surface layer 108 to the buried layer 104. In addition, the capacitor 130 includes a second polysilicon 136 with p-type majority carrier dopants (e.g., boron). The second polysilicon 136 extends inside the second dielectric liner 133, 134, 135 and fills the second trench 131 to the top side 103 of the semiconductor surface layer 108. The capacitor 130 also includes a shallow implant region 129 having majority carrier dopants of the second conductivity type. The shallow implant region 129 extends in the semiconductor surface layer 108 between the second trenches 131 within the second deep doped region 132.

The semiconductor device 100 includes a metallization structure that extends over the semiconductor surface layer 108. The metallization structure includes conductive features that connect the first polysilicon 126 to the first deep doped region 122 for the trench-based isolation structures 120, as well as second conductive features connected to the second polysilicon 136 to form a first capacitor plate, and further conductive features connected to the second deep doped region 132 to form a second capacitor plate of the capacitor 130. The metallization structure includes a first dielectric structure layer 154 formed over the semiconductor structure, and a multi-level upper metallization structure 156. In one example, the first dielectric 154 structure layer is a pre-metal dielectric (PMD) layer disposed over the transistors 101 and the upper surface of the semiconductor structure. In one example, the first dielectric structure layer 154 includes silicon dioxide ($SiO_2$) deposited over the transistors 101, the semiconductor surface layer 108 and the STI structures 118. The metallization structure 154, 156 covers the transistors 101 and provides internal and/or external electrical interconnection to the transistor source, drain and gate terminals.

The PMD layer 154 includes contact structures 160 (e.g., tungsten) that provide direct electrical connection (e.g., direct contact or connection through a silicide layer such as $CoSi_2$, not shown) to one or more features of the transistors 101. The PMD material layer 154 is formed over the illustrated structure, with contact structures 160 formed therein to provide electrical interconnection access for one or more further upper metallization layers 158 and 164-168. In one example, a silicide is formed over the top surfaces of the source, drain and gate electrode structures of the transistors 101, and over the tops of the polysilicon features 126, 136 and to the deep doped regions 122, 132. Contacts 160 of the PMD layer 154 are connected to the polysilicon features 126, 136 and to the deep doped regions 122, 132 of the isolation structure 120 and the capacitor 130.

The upper metallization structure 156 includes one or more layers. In the illustrated example, the upper metallization structure 156 includes a first metallization layer 158 formed over the PMD layer 154, as well as further metallization layers 164, 165, 166, 167, and 168 progressively formed over the preceding layer as shown in FIG. 1. The device 100 in FIGS. 1 and 2 is shown as a wafer 170 prior to singulation and packaging, but the illustrated structure represents the described features after separated as a die for packaging. Although the example die 170 is an integrated circuit with multiple components, such as transistors 101, other stand-alone discrete semiconductor device implementations can include a single transistor or other electronic component with an isolation structure 120 and at least one capacitor 130.

The upper metallization structure 156 is a 6 layer with a first layer 158, referred to herein as an interlayer or interlevel dielectric (ILD) layer. Different numbers of layers can be used in different implementations. In one example, the first ILD layer 158, and the other ILD layers of the upper metallization structure 156 are formed of silicon dioxide ($SiO_2$) or other suitable dielectric material. In certain implementations, the individual layers of the multi-layer upper metallization structure 156 are formed in two stages, including an intra-metal dielectric (IMD, not shown) sub layer with conductive metal routing features or lines 162 (e.g., aluminum, copper, etc.), and an ILD sublayer overlying the IMD sub layer with conductive contacts or plugs 163 (e.g., tungsten vias). The individual IMD and ILD sublayers can be formed of any suitable dielectric material or materials, such as SiO$_2$-based dielectric materials. The first layer 158, and the subsequent layers in the upper metallization structure 156 include conductive metallization interconnect structures 162, referred to as lines, formed on the top surface of the underlying layer. In this example, the first layer 158 and the subsequent ILD layers also include conductive vias 163, such as tungsten or aluminum that provide electrical connection from the metallization features 162 of an individual layer to an overlying metallization layer.

The example of FIG. 1 includes a second layer 164 disposed over the first layer 158. The ILD layer 158 includes conductive interconnect structures 162 and vias 163. The structures 162, 163 can be the same metal or different metals in various implementations. The individual layers can be constructed using any suitable metallization fabrication processing, such as single damascene or dual damascene processes. The illustrated structure includes further metallization levels with corresponding dielectric layers 165, 166 and 167, as well as an uppermost or top metallization layer 168. The individual layers 165-168 in this example include conductive interconnect structures 162 and associated vias or contact plugs 163.

The semiconductor structure, the electronic components (e.g., the transistors 101), the capacitor 130, the first dielectric structure layer 154 and the upper metallization structure 156 form a wafer or die 170 with an upper side or surface 171. The upper side 171 of the metallization structure 156 forms an upper side of the wafer or die 170. The top metallization layer 168 includes conductive features 169, such as upper most aluminum vias. The conductive features 169 include a side or surface at the upper side 171 of the wafer or die 170 at the top of the uppermost metallization layer 168. Any number of conductive features 169 may be provided. One or more of the conductive features 169 can be electrically coupled with an electronic component such as one of the transistors 101.

The upper ILD dielectric layer 168 in one example is covered by one or more passivation layers 173 (e.g., protective overcoat (PO) and/or passivation layers), for example, silicon nitride (SiN), silicon oxynitride (SiO$_x$N$_y$), or silicon dioxide (SiO$_2$). In one example, the passivation layer or layers 173 include one or more openings that expose a portion of the conductive features 169 to allow electrical connection of the features 169 to corresponding contact structures 174. The contact structures 174 extend outward (e.g., upward along the "Z" direction in FIG. 1) from the upper side 171 of the metallization structure 156. The individual contact structures 174 in one example include a conductive seed layer, such as copper that extends outward from the upper side 171 of the metallization structure 156. In one example, the contact structure 174 includes titanium (Ti) or titanium tungsten (TiW).

The metallization structure 154, 156 includes first conductive features 160, 162 of the metallization structure 154, 156 that connect the first polysilicon 126 to the first deep doped region 122. This provides an isolation trench structure 120 that electrically isolates the active region 110 of the semiconductor structure from the capacitor 130 and from other regions of the wafer or die 170. In addition, the metallization structure includes second conductive features 160, 162 that are connected to the second polysilicon 136 to form a first capacitor plate, as well as further conductive features 160, 162 that are connected to the second deep doped region 132 to form a second capacitor plate. The metallization structure 154, 156 allows for further conductive connections (not shown) to connect the first and second capacitor plates to other circuitry within the wafer or die 170, and/or to provide external connection for one or both of the first and second capacitor plates.

FIG. 2 shows a top view of a portion of the device 100. In the illustrated example, the isolation structure 120 extends around the lateral periphery of the active region 110, and also extends around three sides of a capacitor region. In this example, the capacitor region includes multiple capacitor trenches 131, three of which are shown in the side view of FIG. 1. In one example, the capacitor trench width 138 is approximately 1.2 µm, and a spacing distance between adjacent capacitor structures is approximately 0.6 µm. In one example, a shallow n-well implant (e.g., regions 129 in FIG. 1, not shown in FIG. 2) extends into the capacitor region by approximately 0.1 µm, and encloses the capacitor region by approximately 0.65 µm. In one example, the NBL 104 extends into the capacitor region as shown in FIG. 1. In another example (not shown) the capacitor region is enclosed by the NBL 104. In one example, a silicide block layer (not shown) extends beyond the capacitor region by approximately 0.25 µm, and extends into the capacitor region by approximately 0.255 µm.

Referring also to FIGS. 3-18, FIG. 3 shows a method 300 to fabricate an electronic device, such as an integrated circuit or standalone device. The illustrated method 300 also includes a process or method to fabricate an isolation structure in a semiconductor device. FIGS. 4-18 show integrated circuit of FIGS. 1 and 2 at various stages of fabrication according to the method 300. The method 300 begins at 302 with an n-type implantation to form an n-doped region, such as the NBL region 104 in FIG. 1.

In one example, a first epitaxial silicon layer is formed over the upper surface of a silicon wafer substrate 102, and all or a portion of the first epitaxial layer is implanted with n-type dopants (e.g., Sb, etc.) at 302 to form the NBL 104. In one example, all or a portion of the first epitaxial layer is implanted at 303 with p-type dopants (e.g., boron, etc.) to form the p-type buried layer 106 with the upper side 107. In one example, the PBL region 106 is formed using ion implantation through the final silicon surface (e.g., the top of the second epitaxial layer), with a depth set by using a high implantation energy. In one example, a further epitaxial silicon deposition process is performed at 304, which deposits a second epitaxial silicon layer over the first epitaxial layer. At 306, the semiconductor surface layer 108 (e.g., labeled P-BODY) is implanted with p-type majority carrier dopants (e.g., boron) and extends downward along the Z direction from the first side 103 to the upper side 107 of the PBL 106.

Figure 4:
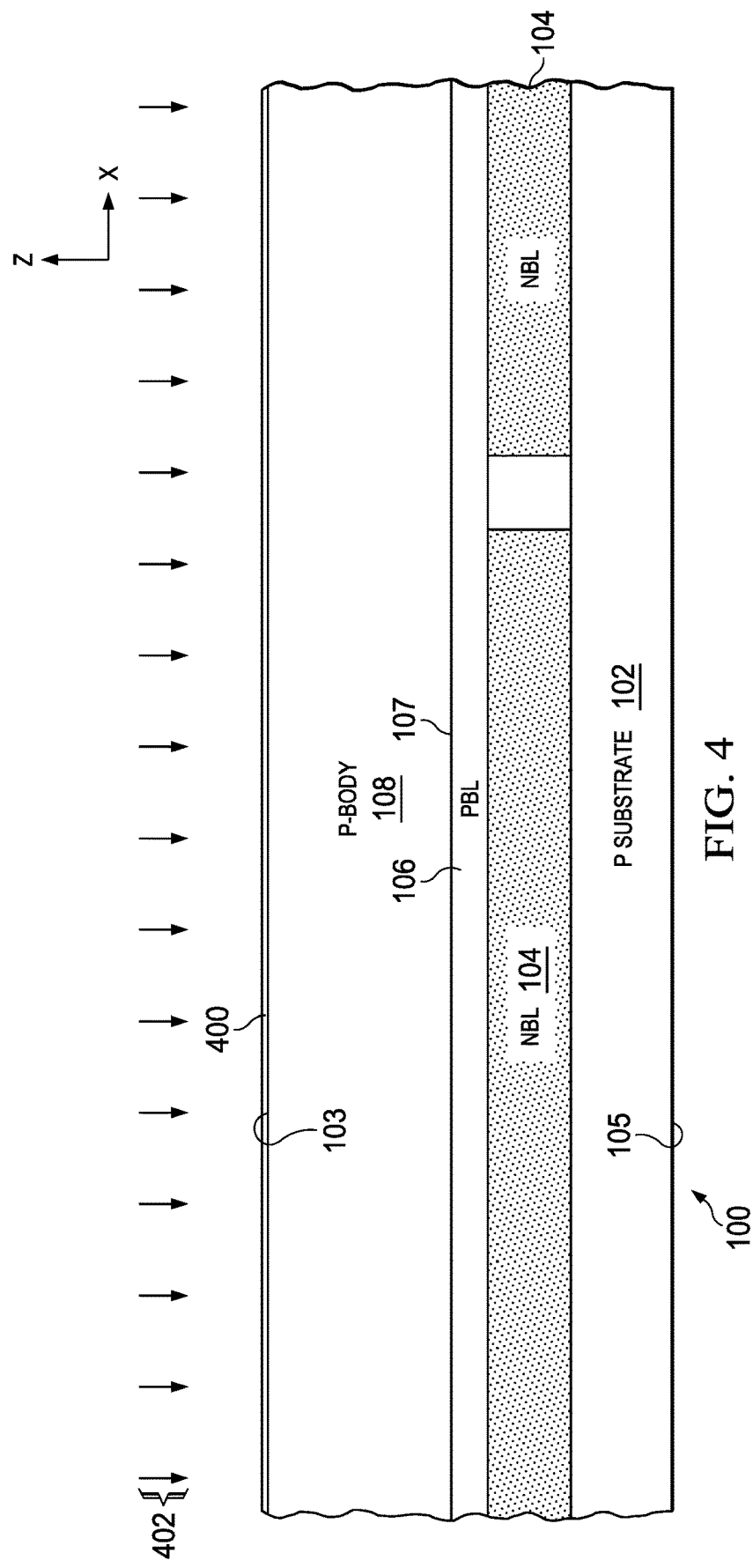
FIGS. 4-18 are partial sectional side elevation views of the integrated circuit of FIGS. 1 and 2 at various stages of fabrication according to the method of FIG. 3.

The method 300 also includes depositing an etch stop layer at 306. FIG. 4 illustrates one example, in which a deposition process 402 is performed that deposits a nitride or oxynitride or oxide layer 400 on the first side 103 of the semiconductor structure. In one example, the layer 400 operates as an etch stop layer for subsequent planarization, such as chemical mechanical polishing (CMP). In one example, the etch stop layer 400 includes a pad oxide formed to a thickness of approximately 150 Å, such as 100-160 Å, and a nitride formed over the pad oxide to a thickness of approximately 0.2 µm.

Figure 5:
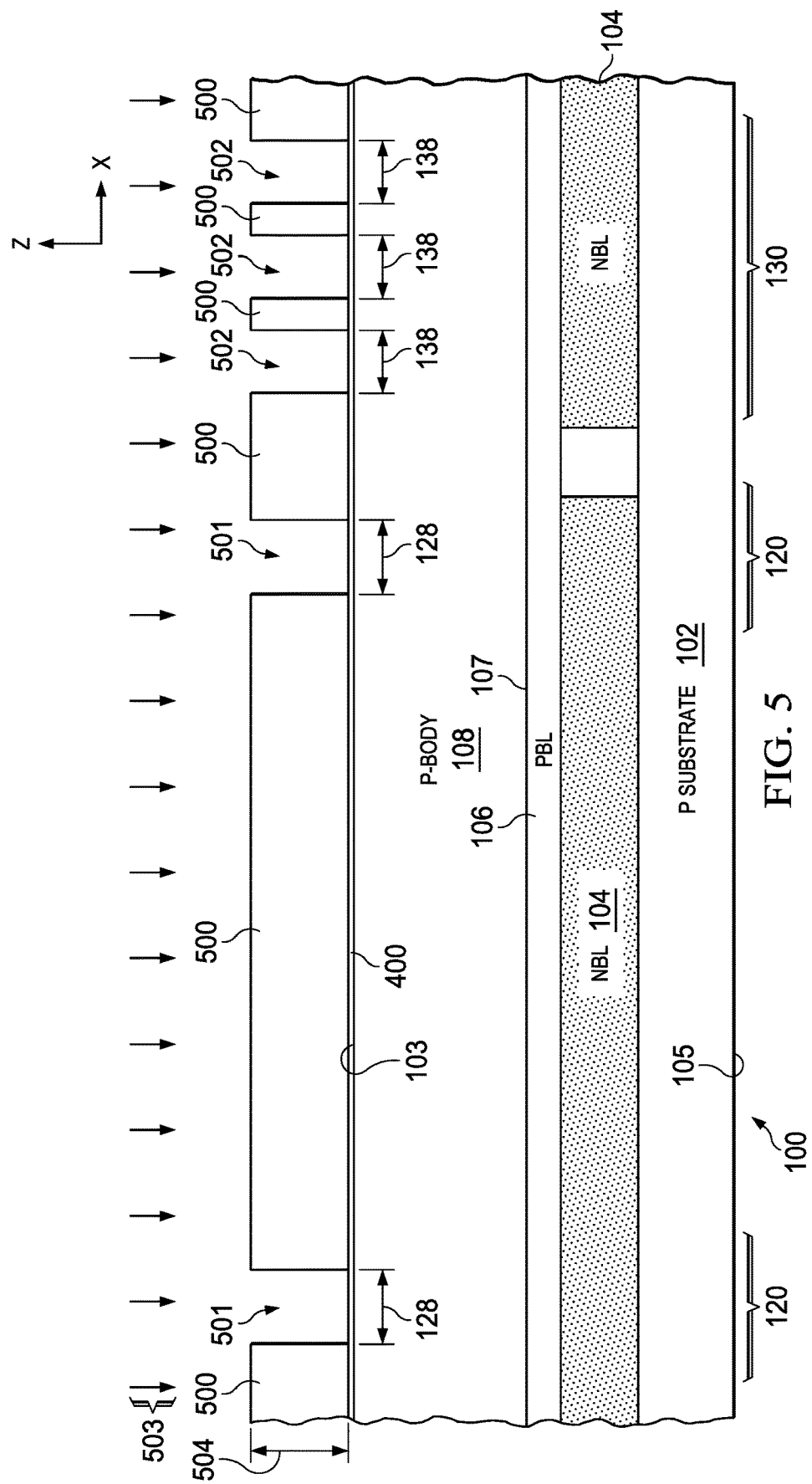

The method 300 further includes depositing and patterning a thick resist layer at 308 with openings for isolation structures and second openings for trench capacitors. FIG. 5 shows one example, in which a process 503 is performed. The process 503 deposits and patterns a resist mask 500 over the hard mask layer 400 on the first surface 103 of the semiconductor structure. The process 503 in one example includes forming the resist layer 500 and patterning the first opening 501 with a first width 128, as well as patterning the second opening 502 with a second width 138, where the first width 128 is greater than the second width 138. The first opening 501 is patterned above the prospective isolation structures 120 with a width 128 that corresponds to the desired width of the prospective isolation structure trenches 121 (e.g., FIG. 1). The second openings 502 are patterned above the prospective capacitor structure 130 with widths 138 that correspond to the desired widths of the prospective capacitor trenches 131 (FIG. 1). In one example, the width 128 of the first resist opening 501 is approximately 1.5 μm, and the width 138 of the second resist openings 502 is approximately 1.2 μm.

Figure 6:
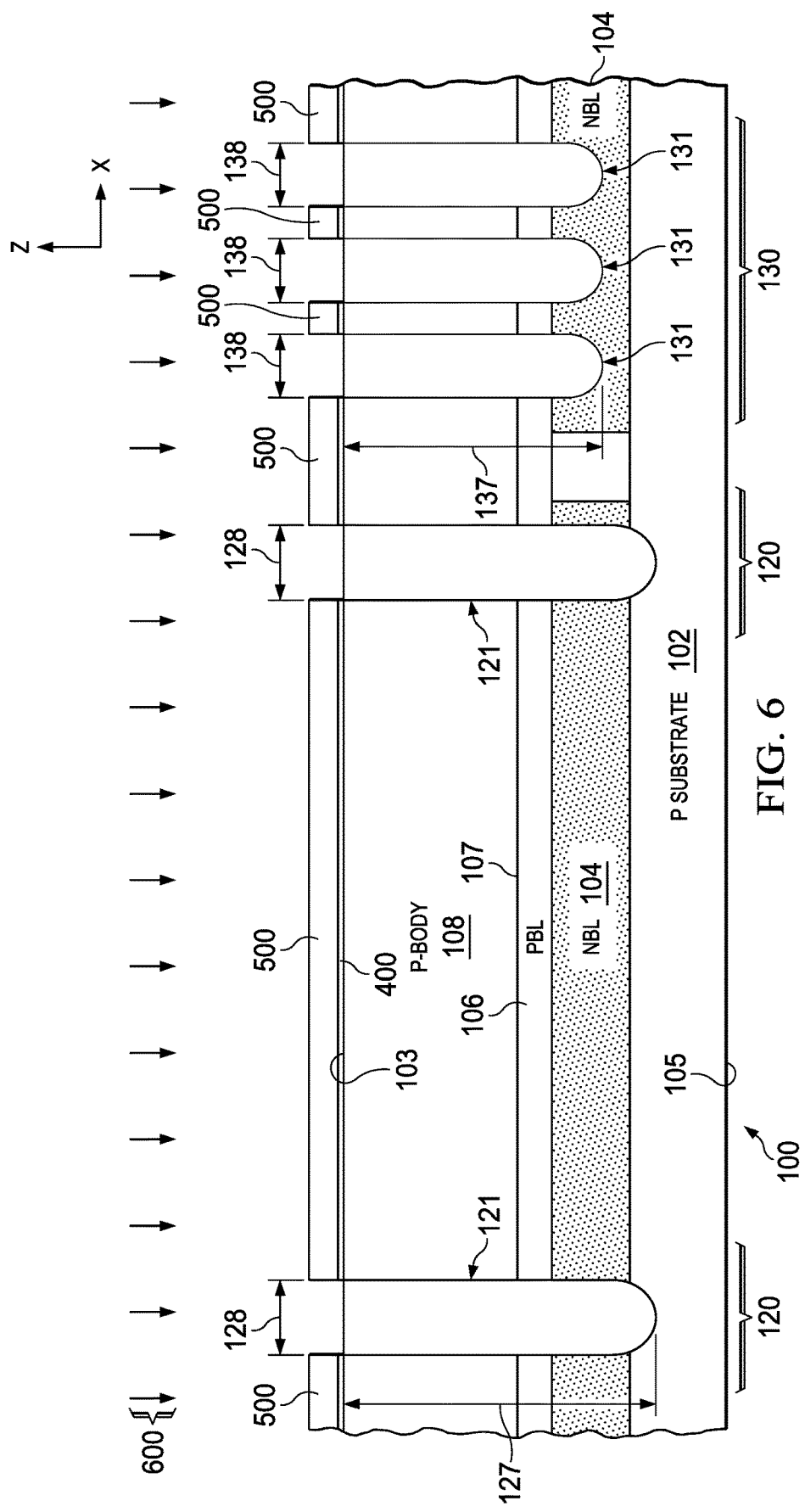

The method 300 continues at 310 with deep trench etching through the nitride 400 and silicon of the semiconductor surface layer 108, the PBL 106, and through at least a portion of the NBL 104 to form the trenches 121 and 131 using the patterned resist 500 as an etch mask. FIG. 6 shows one example, in which an etch process 600 etches through the resist opening 501 first trench 121 extending through the semiconductor surface layer 108 into the buried layer 104. The etch process 600 concurrently etches through the second openings 502 to form the trenches 131 that extend into the NBL 104. In the illustrated example, the first trench width 128 generally corresponds to the dimension of the first opening 501, and the second trench width 138 generally corresponds to the dimension of the second opening 502. The wider first opening 501 causes the first trench 121 to extend to the first depth 127 (e.g., approximately 6.8 μm, such as 6.2 μm to 7.2 μm, which is greater than the second depth 137 of the second trenches 131.

Figure 7:
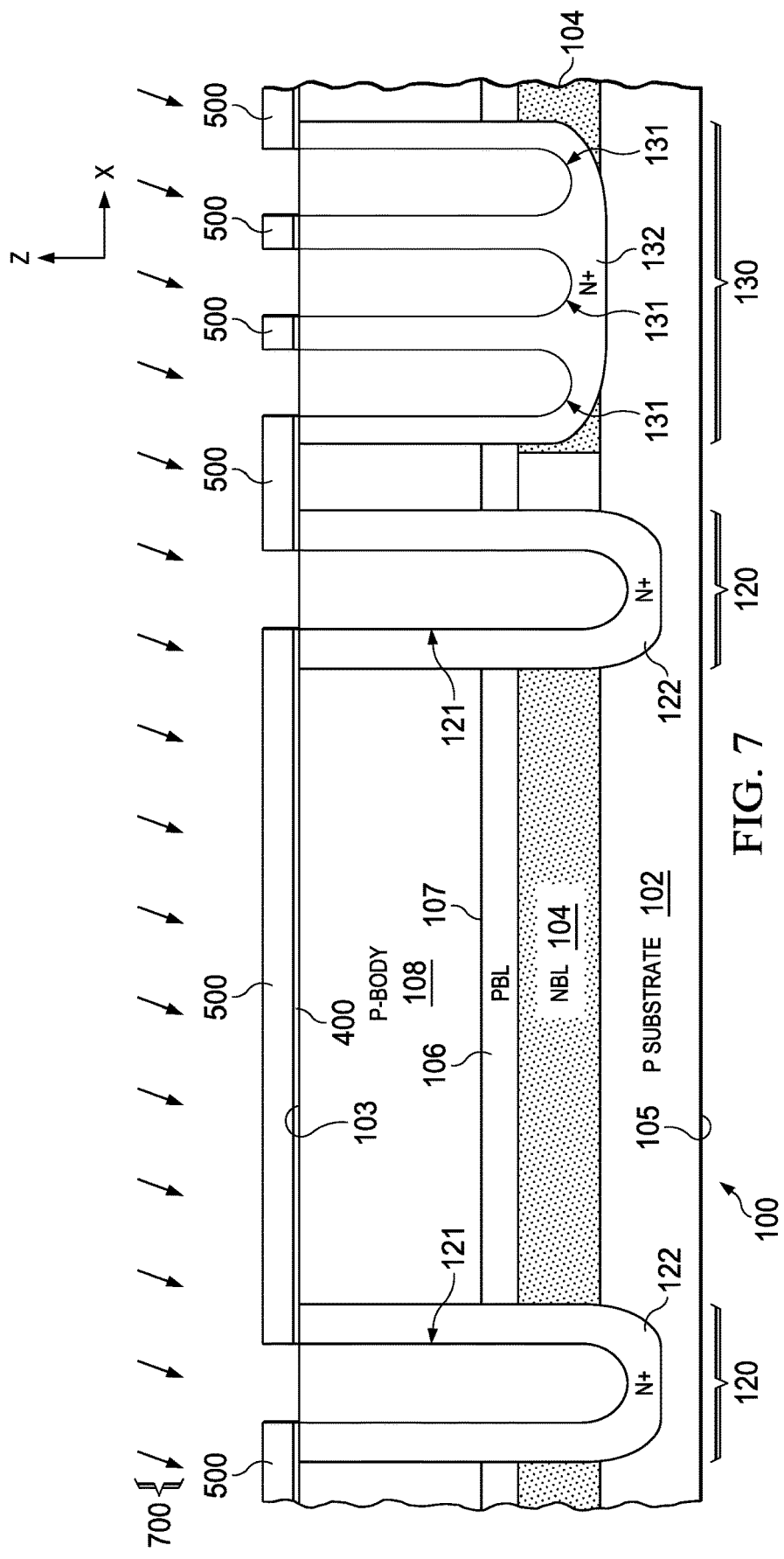
Figure 8:
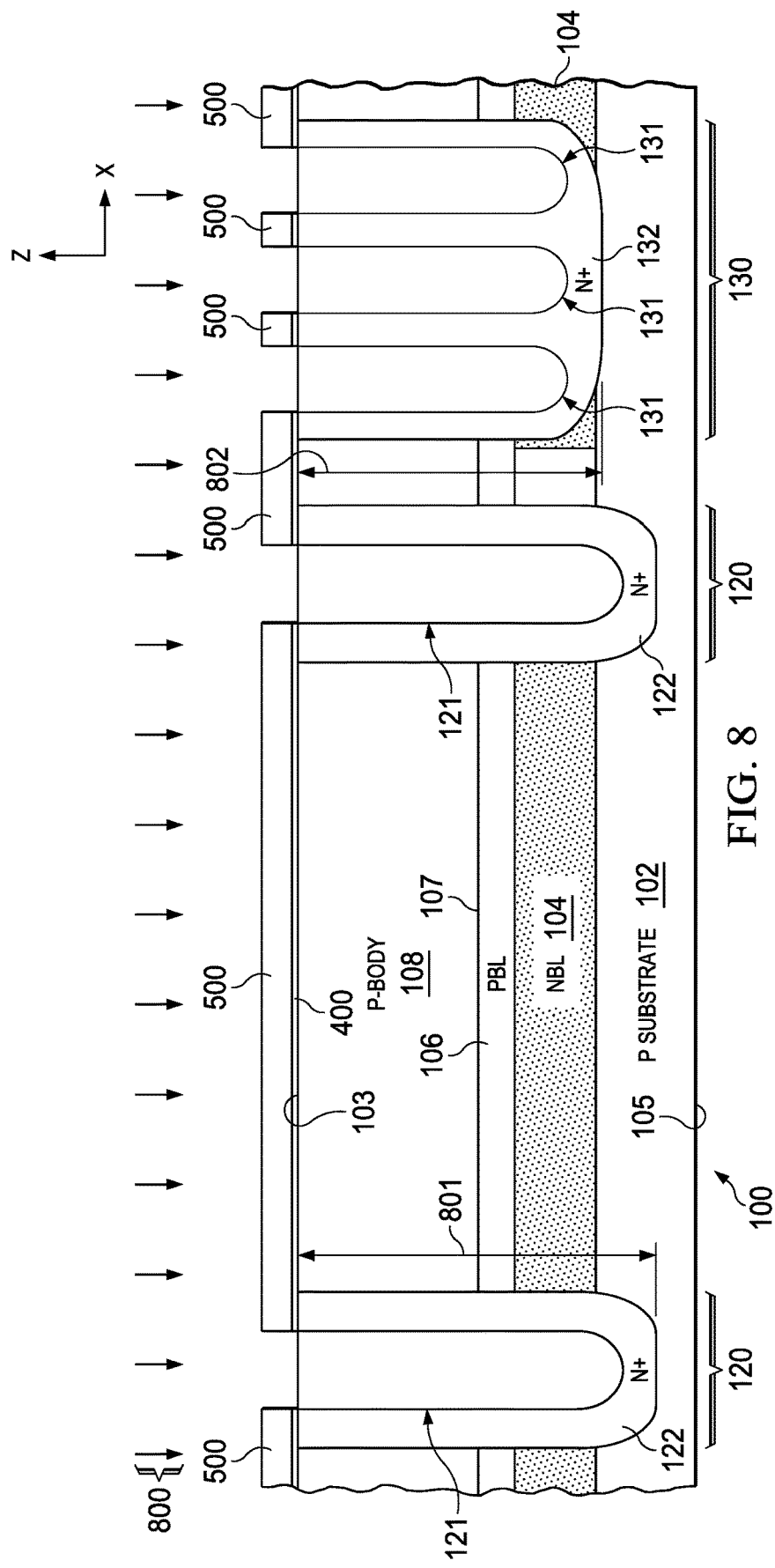

Continuing at 312 and 314, the method 300 further includes one or more deep trench implantations to form the first deep doped region 122 surrounding the first trench 121 and the second deep doped region 132 surrounding the second trench 131. FIGS. 7 and 8 show an example that includes performing a first implantation process 700 using the remaining resist mask 500 to concurrently implant n-type dopants (e.g., phosphorus) through the openings 501 and 502 to form the first and second deep doped regions 122 and 132, respectively. The first deep doped region 122 surrounds the first trench 121 and extends from the semiconductor surface layer 108 to the buried layer 104. The second deep doped region 132 surrounds the second trench 131 and extends from the semiconductor surface layer 108 to the buried layer 104.

In one example, the first implantation process at 312 is an angled deep N trench sidewall implant. FIG. 7 shows an example, in which an angled implantation process 700 implants phosphorus or other n-type dopants through the resist openings 501 and 502 to implant the sidewalls of the trenches 121 and 131 at a dose of $9 \times 10^4$ cm$^{-3}$ and an implantation energy of 200 keV to form the first and second deep doped regions 122 and 132 at an implant angle of 16 degrees, rotated four times with a 45 degree twist angle relative to a layout direction (e.g., relative to the direction of the transistor source, drain and gate fingers).

At 314, a second implantation is performed to implant the bottoms of the regions 122 and 132. FIG. 8 shows an example, in which an implantation process 800 is performed that implants phosphorus or other n-type dopants through the resist openings 501 and 502 to further implant the silicon below the bottoms of the trenches 121 and 131 at a dose of $9 \times 10^4$ cm$^{-3}$ and an implantation energy of 50 keV at an implant angle of 0 degrees.

Figure 3:
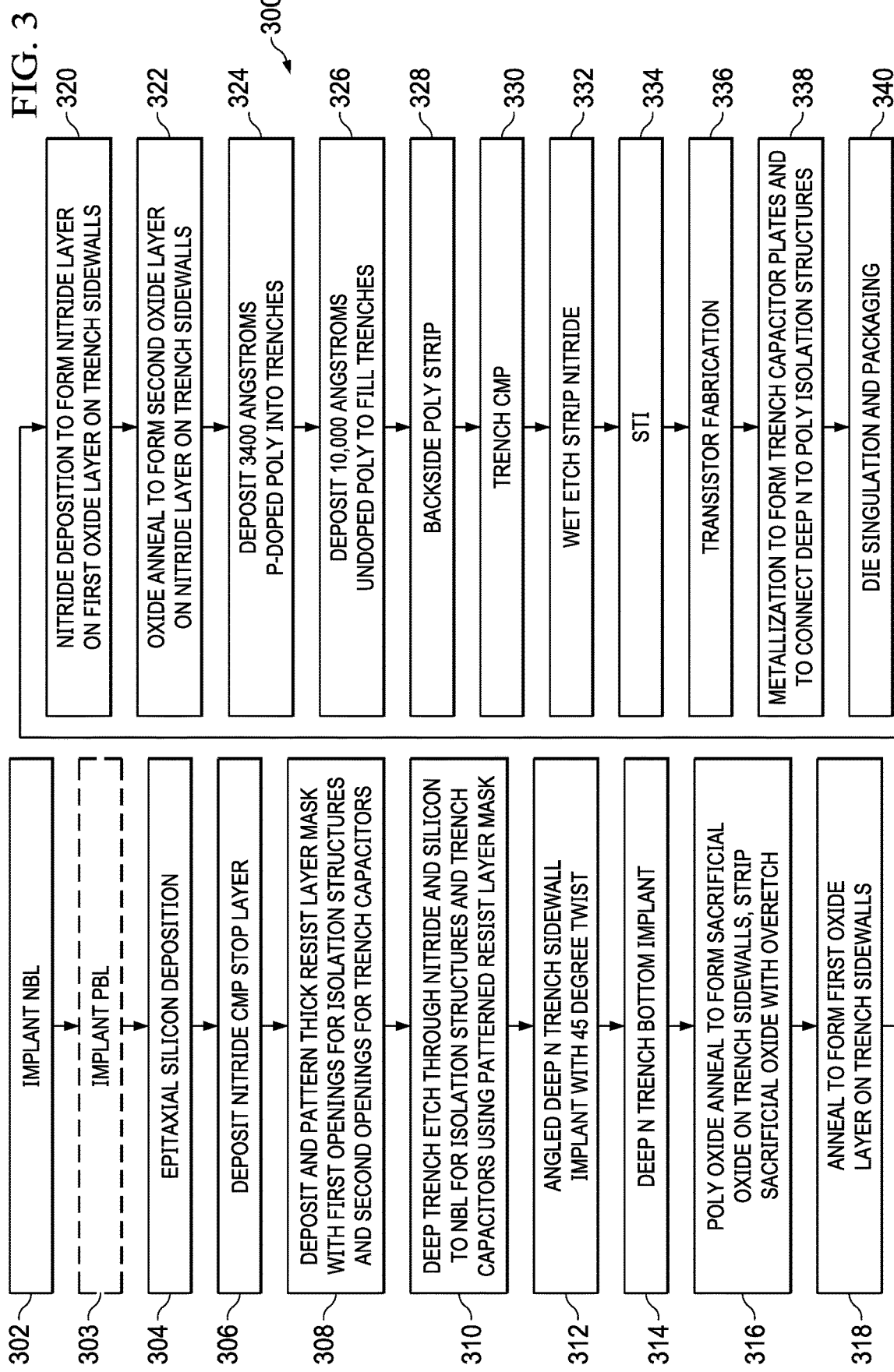
FIG. 3 is a flow diagram showing a method for making a semiconductor device and for making an isolation structure in a semiconductor device.

In one example, an anneal process is performed at 316 in FIG. 3, which oxidizes the silicon of the trench sidewalls and forms a dummy or sacrificial oxide layer on the sidewalls of the trenches 121 and 131, for example, to a thickness of 150 Å. In one example, the sacrificial oxide is then stripped at 316 using a wet cleaning process with a 50% over etch to remove approximately 300 Å of material from the sidewalls of the trenches 121 and 131. In one example, the over etch at 316 removes the deposited sacrificial oxide as well as original silicon that may have been damaged during the implantation at 312 and/or 314.

Figure 9:
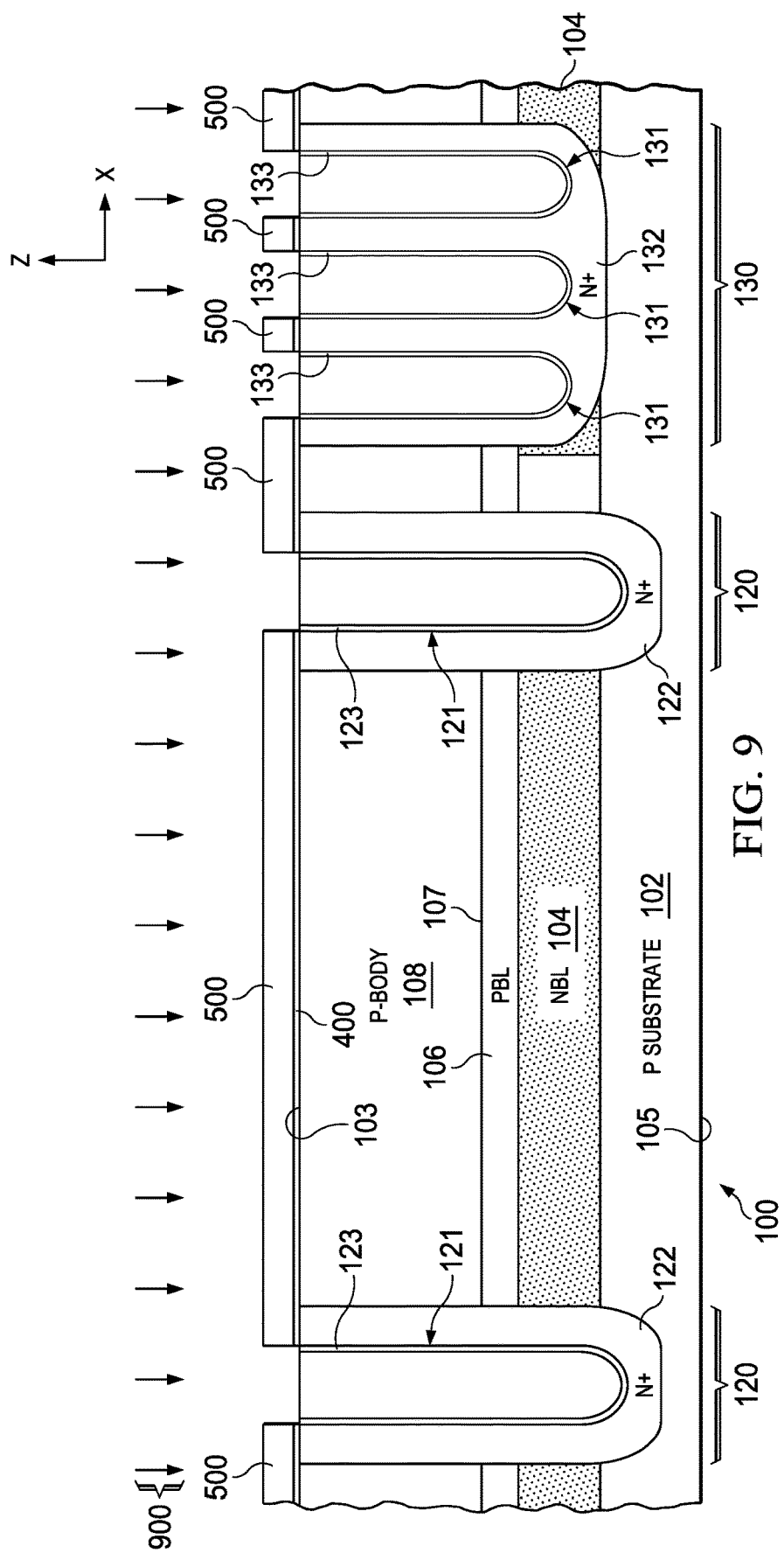
Figure 10:
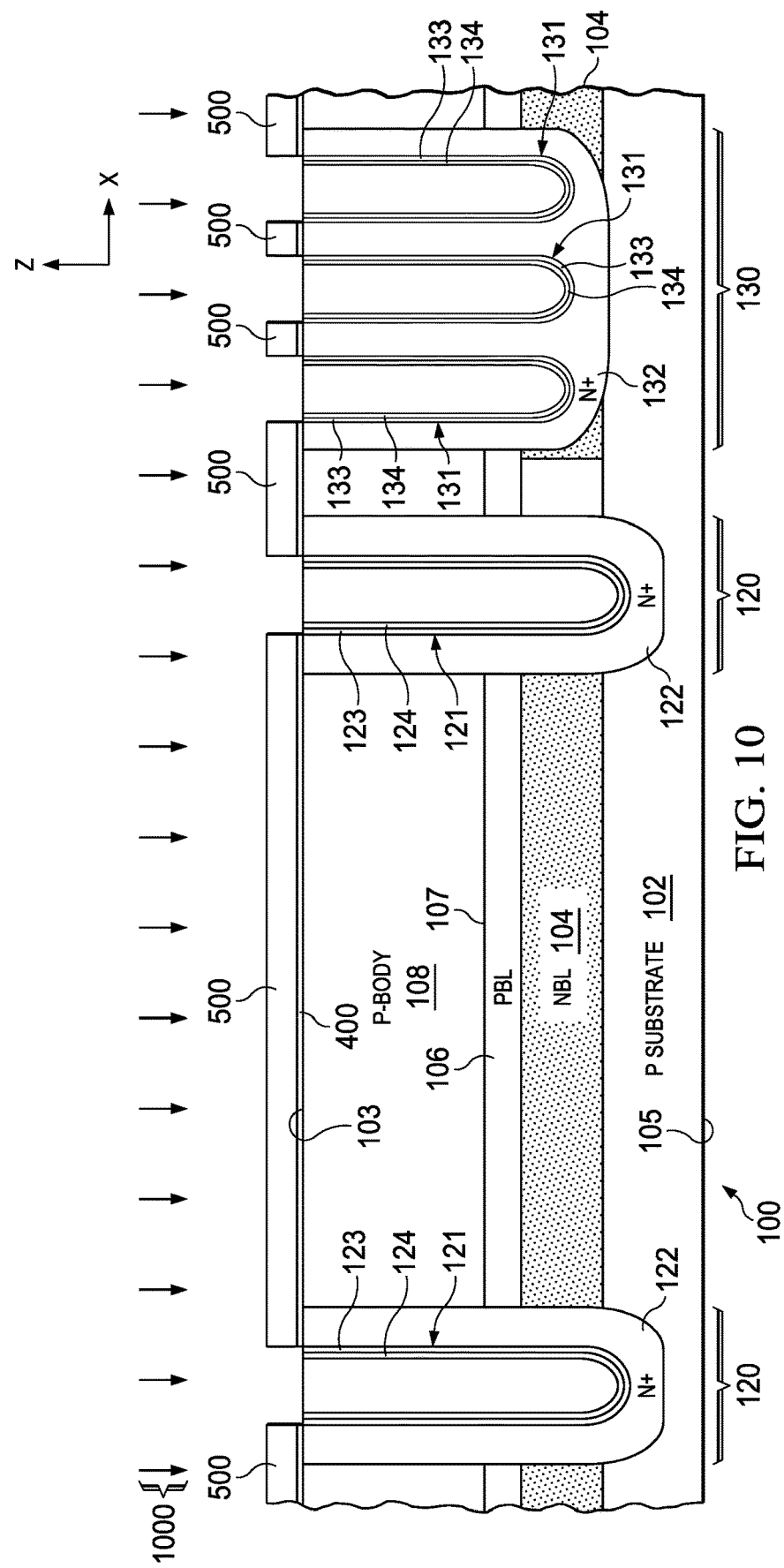
Figure 11:
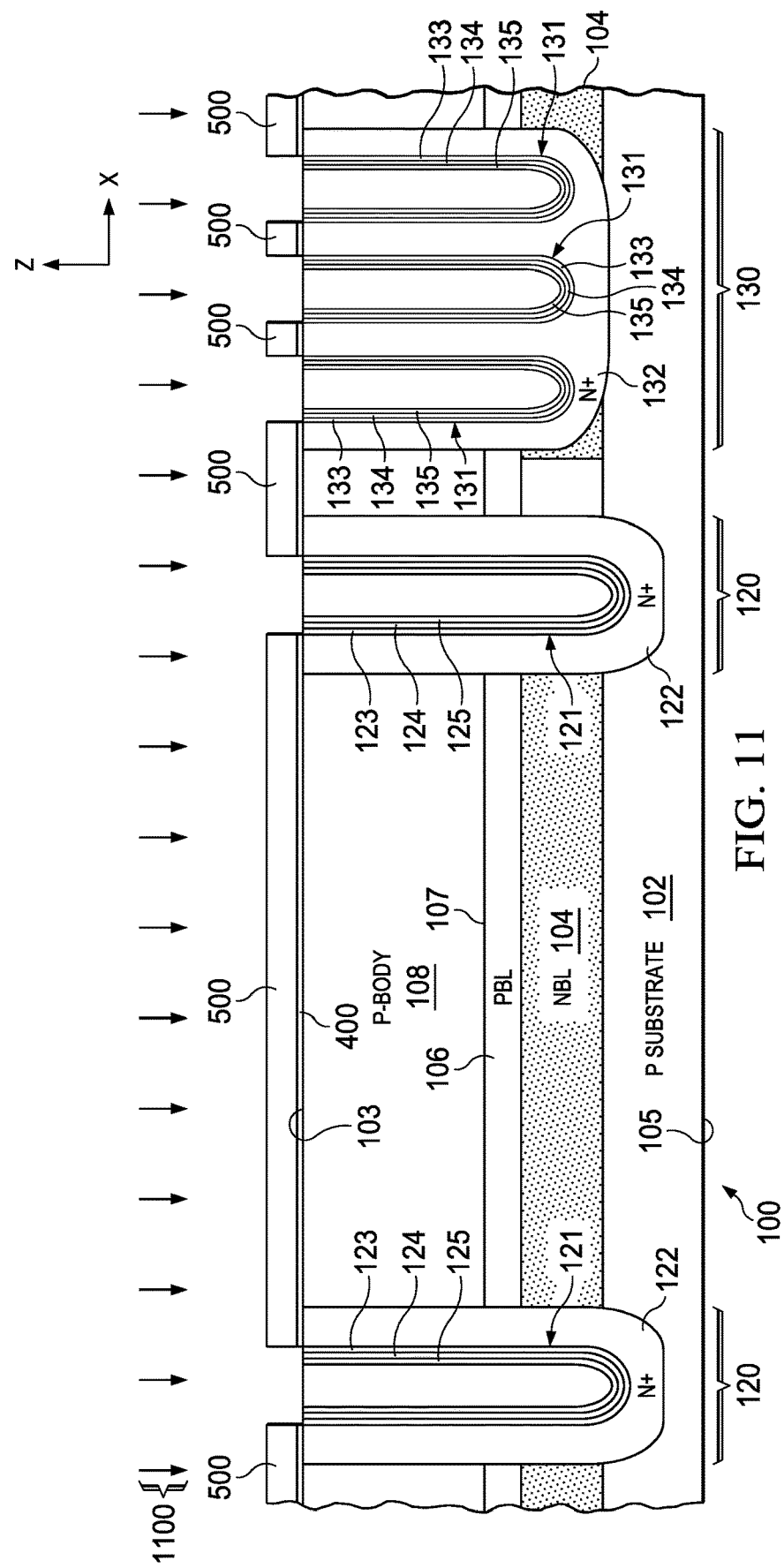

The example method 300 continues at 318, 320 and 322 with deposition processing to form dielectric liners of the sidewalls of the trenches 121 and 131. The dielectric liner deposition processing deposits dielectric material through the first and second openings 501 and 502 of the remaining resist mask 500. Any suitable dielectric can be used that forms a capacitor dielectric in the finished trench capacitor 130. The dielectric liner can be a single layer or a multilayer structure. FIGS. 9-11 illustrate a multi-step deposition that forms an oxide-nitride-oxide (ONO) dielectric liner in each of the trenches 121 and 131.

At 318 in FIG. 3, a first oxide deposition is performed, which forms first oxide layers on the sidewalls of the trenches 121 and 131. FIG. 9 shows one example, in which an oxidation anneal process 900 is performed at 850 degrees C., that deposits silicon dioxide 123 (e.g., $SiO_2$) on the sidewall of the first trench 121, and deposits silicon dioxide 133 and the sidewall of the second trenches 131. In one example, the process 900 (850 degrees C.) causes thermal oxidation of the trench sidewall silicon to form the first oxide layers 123 and 133 to a thickness of approximately 65 Å, for example 60 Å to 70 Å.

At 320, a second deposition process (e.g., a nitride deposition) is performed, that deposits a nitride layer on the first oxide layer along the sidewalls of the trenches 121 and 131. FIG. 10 shows one example, in which a deposition process 1000 (e.g., deposition temperature of 650 degrees C.) deposits nitride material 124 (e.g., silicon nitride, silicon oxynitride) through the first and second openings of the resist layer 500 onto the first oxide layer 123 in the first trench 121, and deposits nitride material 134 through the first and second openings of the resist layer 500 onto the first oxide layer 133 along the sidewalls in the second trenches 131. In one example, the process 1000 forms the nitride material layers 124 and 134 to a thickness of approximately 140 Å, for example, from 106 Å to 166 Å.

At 322, a third deposition process (e.g., an oxide deposition) is performed, that deposits a second oxide layer on the nitride layer along the sidewalls of the trenches 121 and 131. FIG. 11 shows one example, in which wet oxidation process 1100 grows a second oxide layer, such as an oxynitride 125 through the first opening on the nitride layer 124 in the first trench 121. The deposition process 1100 in this example deposits a second nitride layer 135 through the second openings of the resist layer 500 onto the nitride layer 134 in the second trenches 131. In one example, the process 1100 forms the second oxide material layers 125 and 135 to a thickness of approximately 20 Å, for example, 10 Å to 30 Å.

Figure 12:
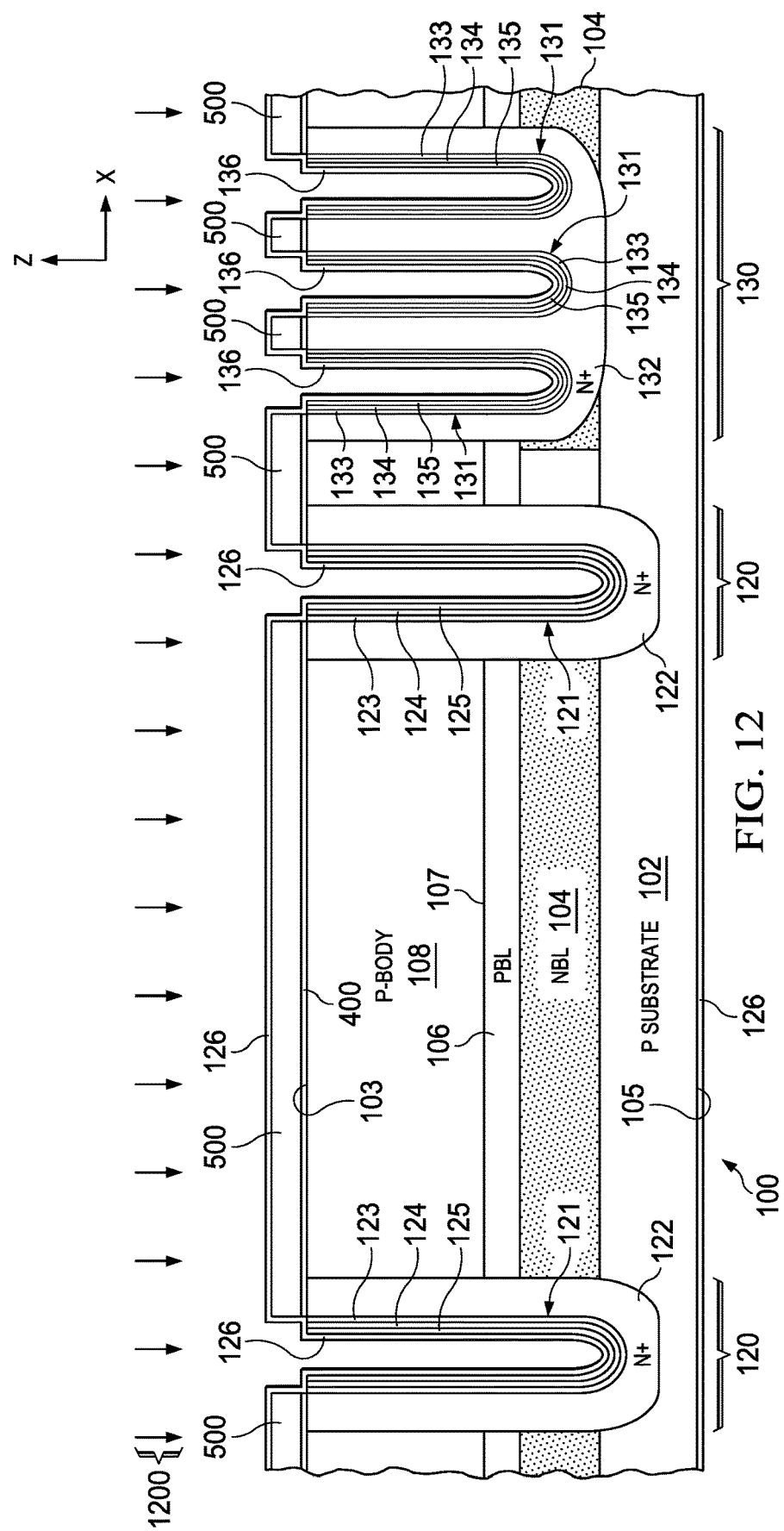

The example method 300 continues at 324 and 326, with deposition of polysilicon to fill the trenches 121 and 131. FIG. 12 shows one example, in which a first polysilicon deposition process 1200 (e.g., at 324 in FIG. 3) deposits a first polysilicon 126 through the first opening of the resist layer 500 to fill the first trench 121. The first polysilicon deposition process 1200 also deposits a second polysilicon 136 through the second openings of the resist layer 500 to fill the second trenches 131. The initial deposition process 1200 in one example deposits p-doped polysilicon 126, 136 with p-type majority carrier dopants (e.g., boron) to a thickness of 3400 Å.

Figure 13:
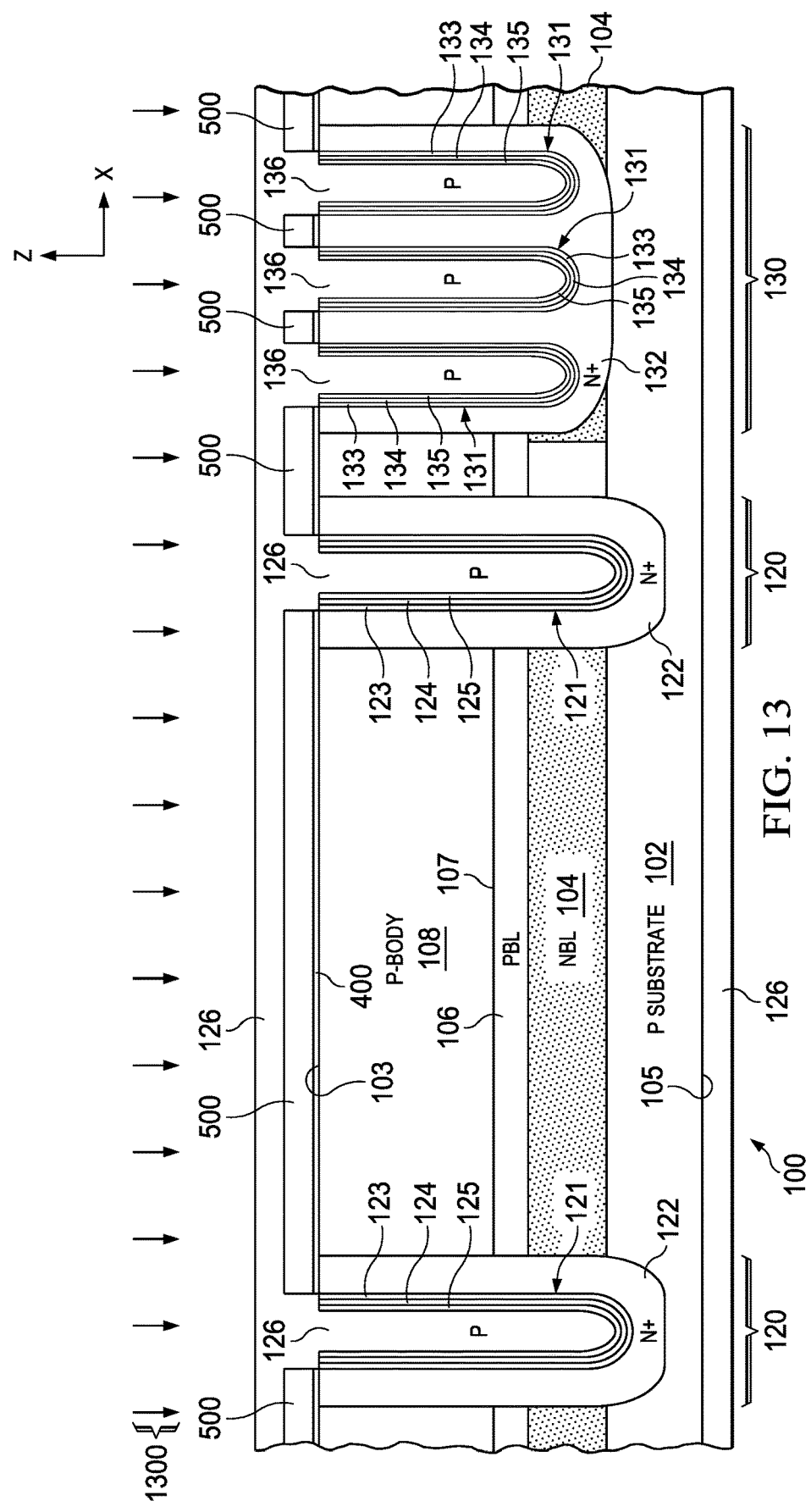

At 326, a second polysilicon deposition is performed that deposits a polysilicon 126 to fill the trench 121, and polysilicon 136 to fill the second trenches 131. FIG. 13 shows one example, in which a second polysilicon deposition process 1300 deposits on doped polysilicon to fill the trenches 121 and 131, for example, to a thickness of approximately 10,000 Å. In one example, the target polysilicon deposition thickness is approximately 13,400 Å, such as 10,900 Å to 15,900 Å, in order to fill the trenches 121 and 131. As shown in FIGS. 12 and 13, in one example, the initial polysilicon deposition process 1200 and the trench fill deposition process 1300 form polysilicon 126, 136 on both sides of the device 100, including deposition along the bottom side 105 of the semiconductor structure.

Figure 14:
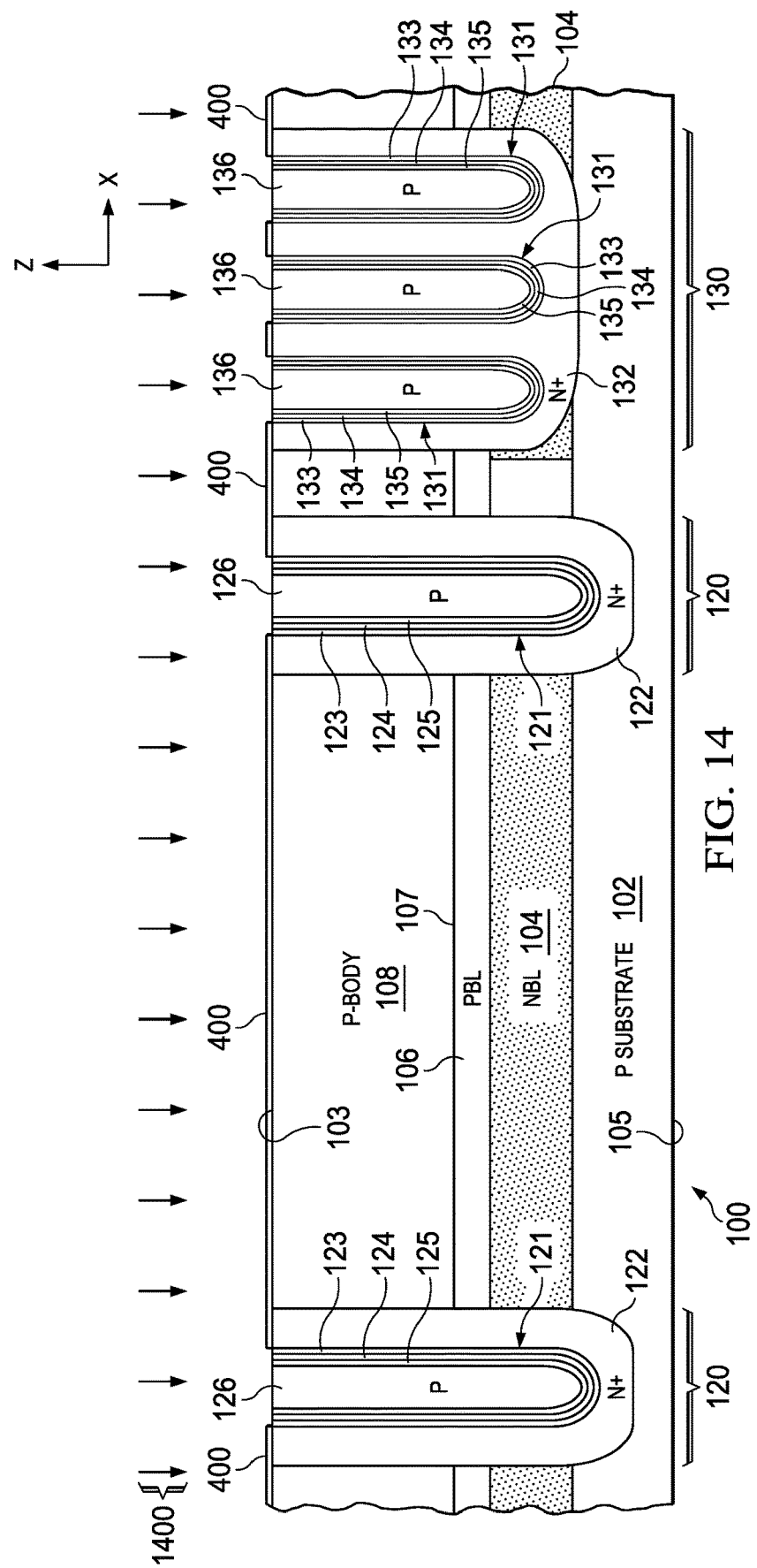
Figure 15:
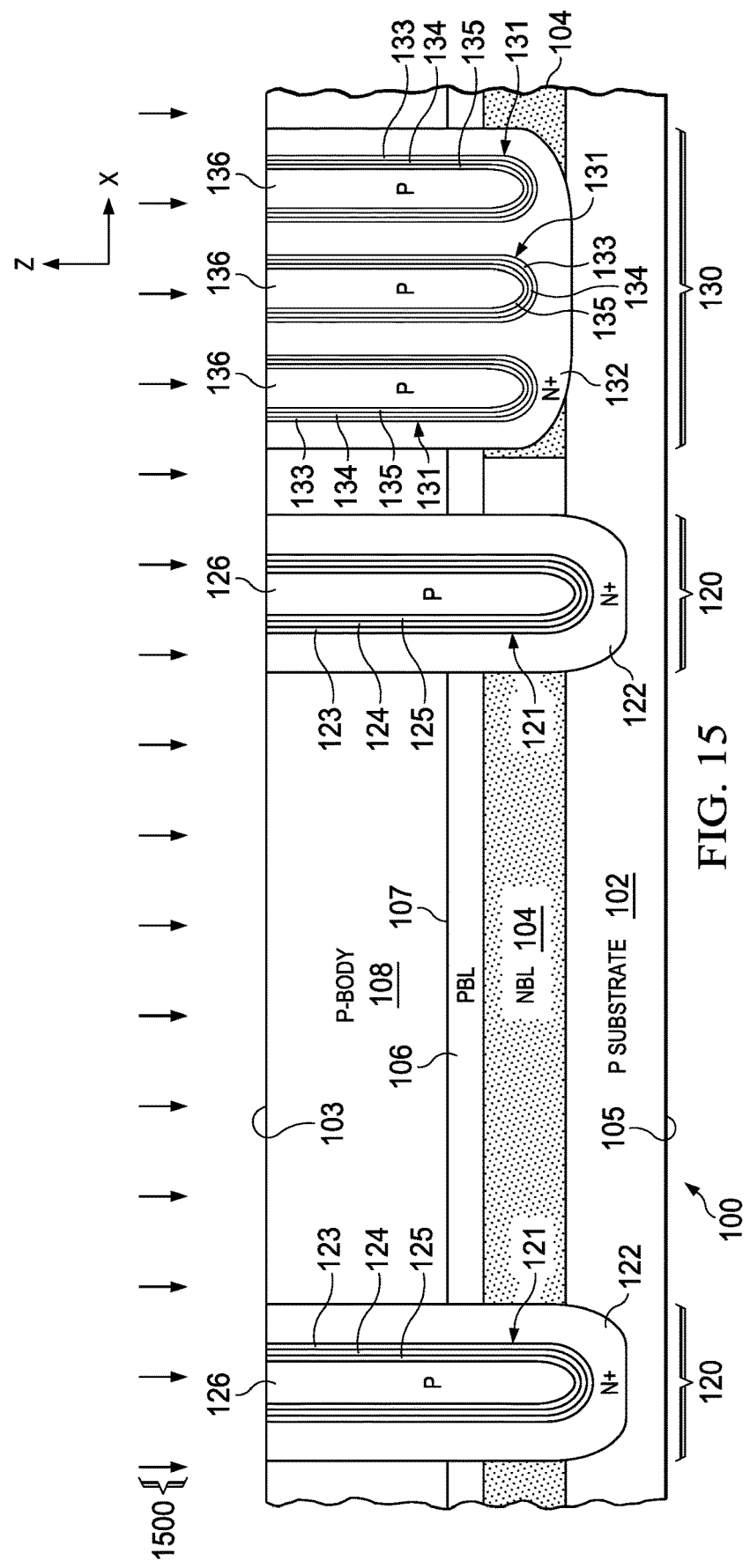

Continuing at 328-332 in FIG. 3, the method 300 further includes a back side polysilicon removal or stripping step at 328. In one example, wet etch process (not shown) is performed, that strips the excess polysilicon from the bottom side 105 of the semiconductor structure. At 330, the top side of the wafer is planarized. FIG. 14 shows one example, in which a chemical mechanical polishing (CMP) process 1400 removes the polysilicon remaining above the top side 103 of the wafer, and planarizes the top side of the wafer. The CMP process 1500 stops on the nitride hard mask layer 400 as shown in FIG. 14. At 332, a wet etch process is performed to strip the remaining nitride hard mask layer. FIG. 15 shows one example, in which a wet etch process 1500 is performed, that removes the remaining nitride layer from the top side 103 of the wafer.

Figure 16:
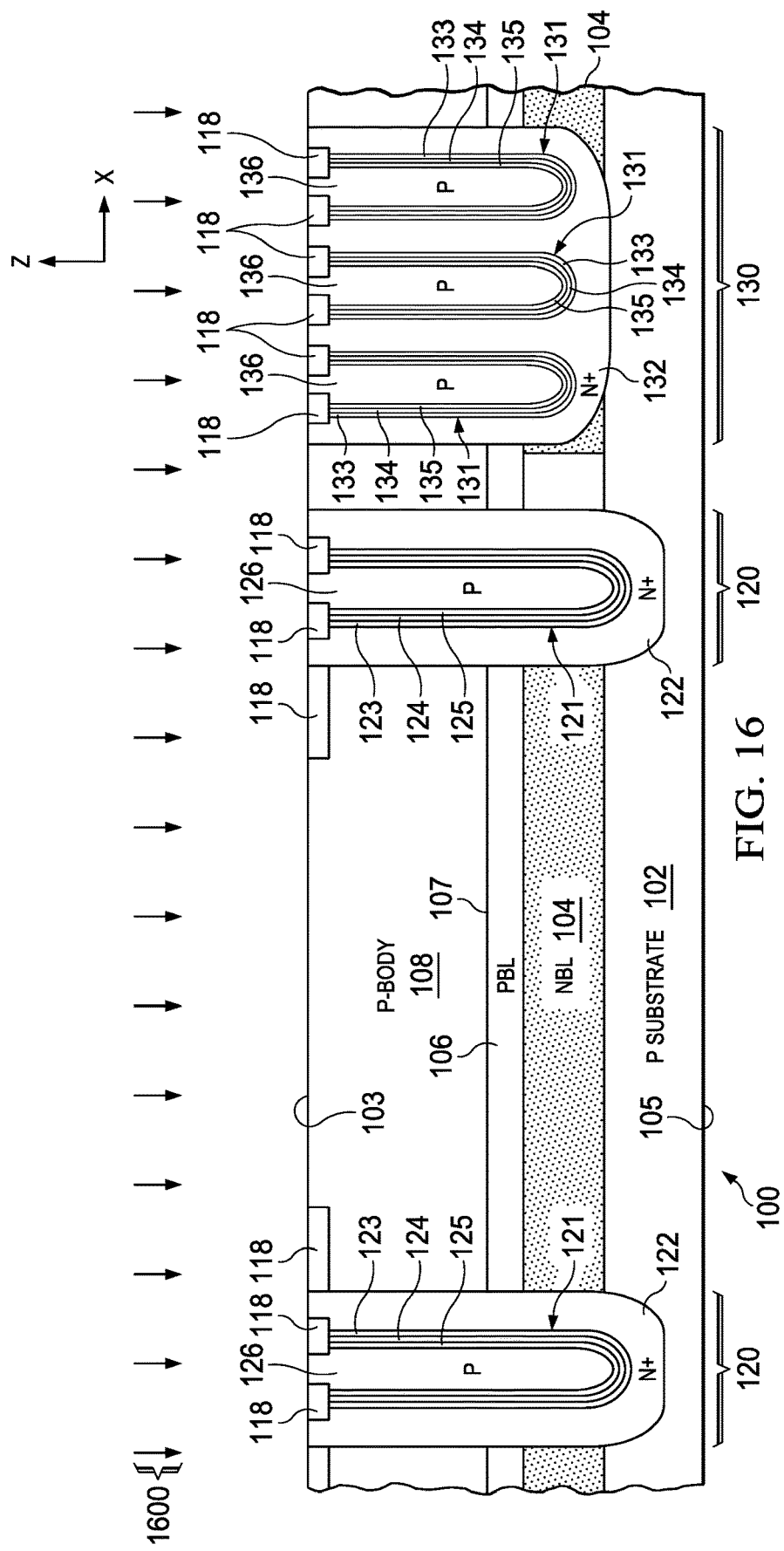

The method 300 also includes shallow trench isolation (STI) processing at 334. FIG. 16 shows one example, in which an STI fabrication process 1600 is performed that etches trenches and fills the trenches with an oxide material 118. In one example, the STI processing includes growing a pad oxide, depositing a nitride layer (not shown) using low-pressure chemical vapor deposition (LPCVD), patterning and etching trenches in the silicon of the surface layer 108 and in the liner and silicon of the trenches 121 and 131, growing a liner oxide in the STI trenches to repair silicon and round off sharp corners, followed by plasma enhanced CVD (PECVD) deposition of TEOS oxide. The processing further includes another chemical mechanical polishing of the trench oxide using the nitride as an etch stop, followed by removal of the nitride etch stop layer.

Figure 17:
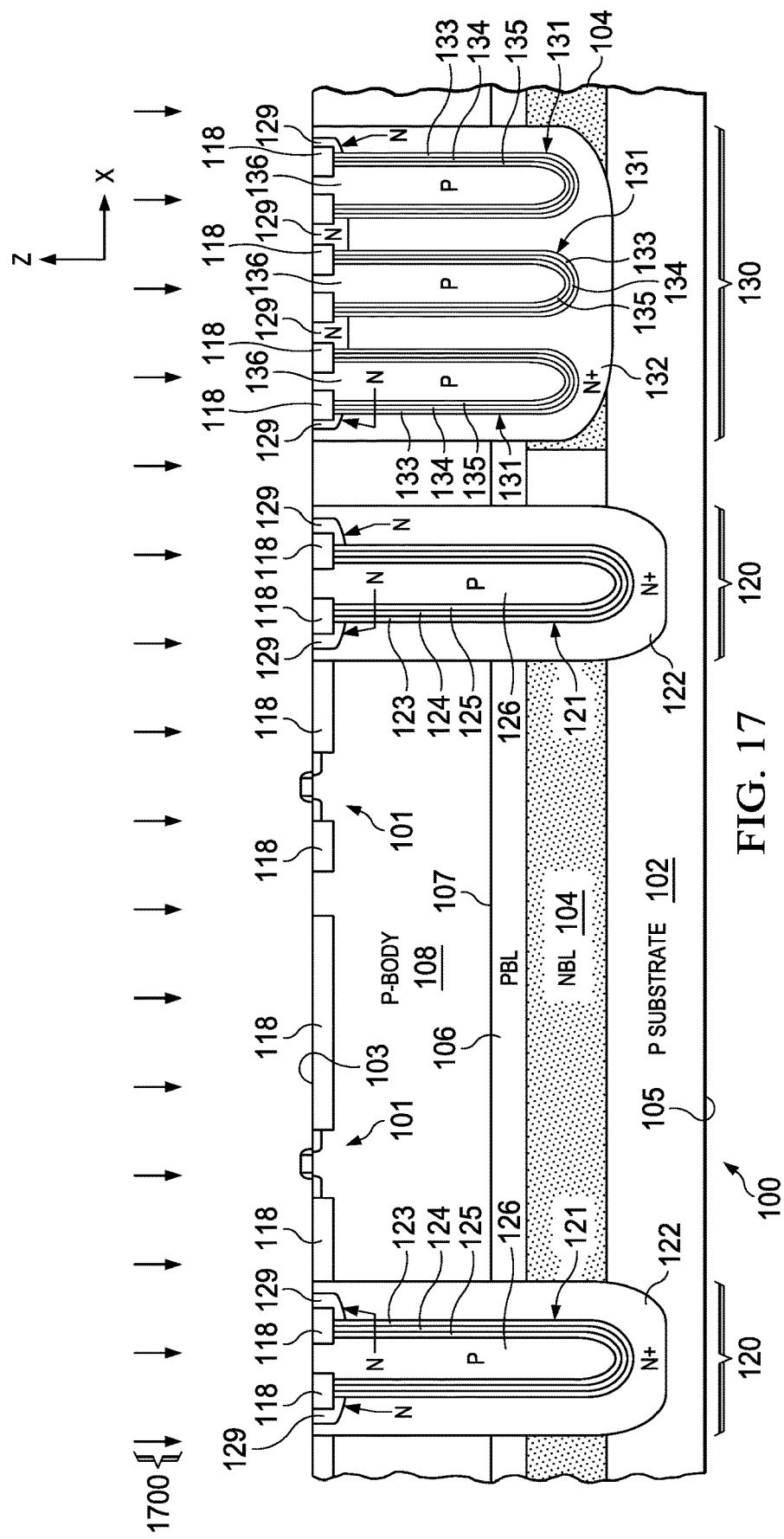

At 336, transistor fabrication processing is performed, including fabricating the transistors 101. FIG. 17 shows a simplified example, in which the transistor fabrication processing 1700 is performed to create the transistor structures 101. In one example, the transistor fabrication at 336 includes performing an implantation process that implants n-type majority carrier into the semiconductor surface layer 108 to form the shallow implant region 129 extending along a side of the first trench 121 within the deep doped region 122. In one example, the same implantation process is used to form lowercase N-p-type source/drain regions of the transistors 101 or features of other components (not shown) of the wafer 170.

Figure 18:
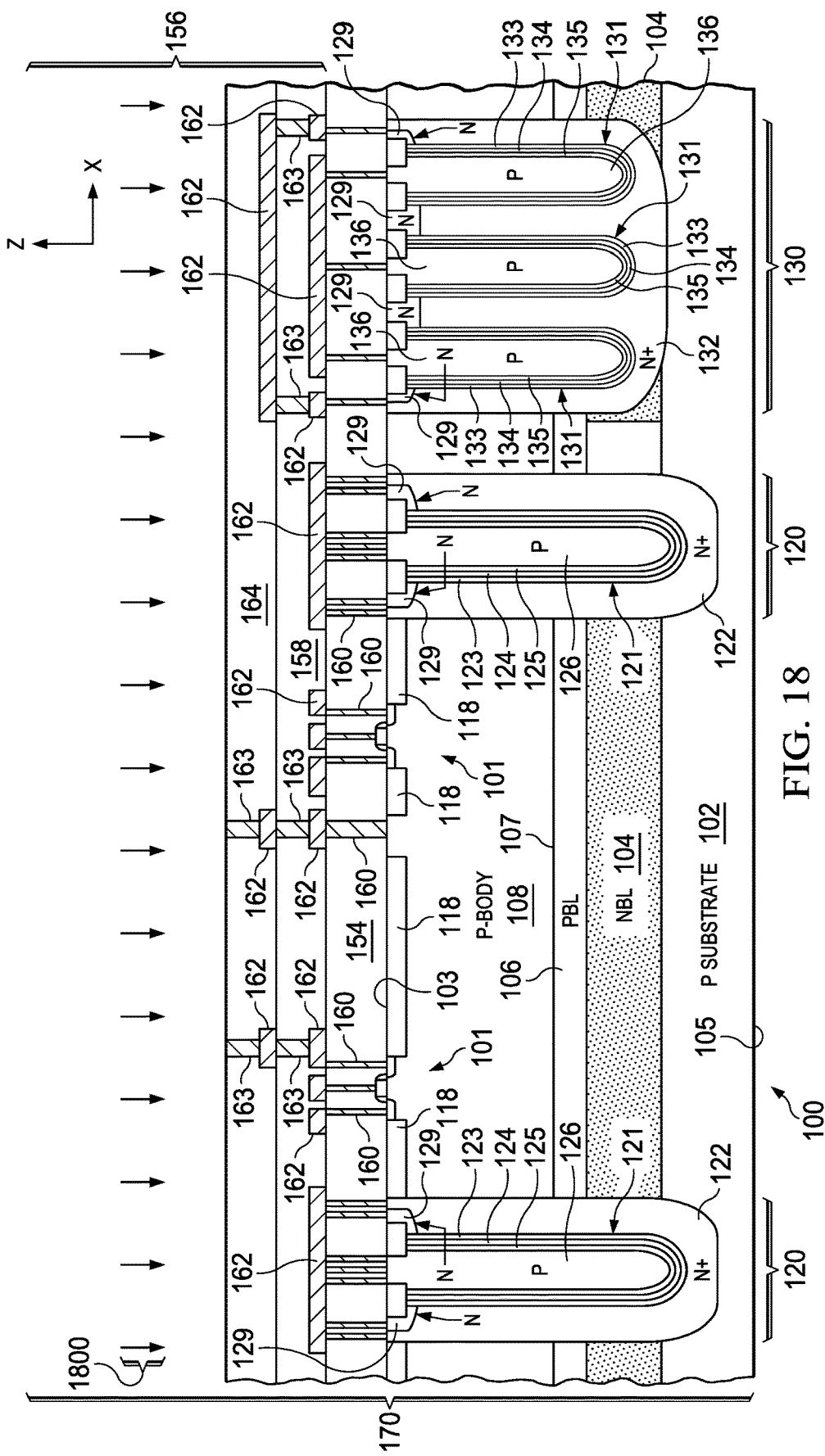

At 338 in FIG. 3, the method 300 continues with metallization to form one or more layers of dielectric with conductive metal features to provide interconnection for the transistors and/or other components of the wafer 170. The metallization processing at 338 includes forming a conductive features to provide capacitor plates for the trench capacitors 130, and to interconnect features of the trench-based isolation structures 120. FIG. 18 illustrates a portion of the metallization processing 1800, that forms first conductive features 160, 162 that extend over the semiconductor surface layer 108 and that connect the first polysilicon 126 to the first deep doped region 122 to form the trench-based isolation structure 120. The metallization processing 1800 also forms second conductive features 160, 162 that connect to the second polysilicon 136 to form a first capacitor plate, and additionally forms further conductive features 160, 162 of the metallization structure 154, 156 that connect to the second deep doped region 132 to form a second capacitor plate.

The process 300 in FIG. 3 also includes die singulation at 340 to separate one or more product dies from the wafer 170. The processing at 340 also includes packaging to provide one or more finished semiconductor devices, such as stand-alone components and/or integrated circuits.

The method 300 provides an integrated process for concurrent fabrication of both trench isolation structures 120 and high density trench capacitors 130 using a shared resist mask 500. Example implementations also use a thick resist mask 500 to facilitate processing of both trench types. The use of a thick shared mask and similar trench structure architectures for both isolation structures 120 and trench capacitors 130 provides economy of processing steps and costs. In addition, the disclosed examples facilitate density advantages compared with use of non-trench isolation structures with deep well implants. In this regard, deep implant isolation features that extend into a semiconductor structure to a buried layer (e.g., a deep n-well implanted and diffused to extend into the NBL 104) involve significant lateral diffusion, thereby extending the lateral extent of the isolation features. Disclosed examples remove the need for a separate deep implant mask, and also facilitate reduction in the deep doped region resistance by using a trench pillar type isolation layout. The disclosed examples, in contrast, provide lateral area control for the isolation features 120 for reduced isolation to isolation spacing using self-aligned deep doped region implantation on deep trench sidewalls, in addition to the fabrication cost and time advantages of concurrently constructing the isolation structures 120 and the trench capacitors 130. These features provide significant advantages, particularly in combination with simple modification of metallization structures by shorting bottom plate and top plate of (e.g., the deep doped region 122 and the p-type polysilicon structure 126) to form the isolation structures 120. Modifications are possible in the described embodiments, and other embodiments are possible, within the scope of the claims.

The following is claimed:

1. A semiconductor device, comprising:
 a semiconductor structure, including:
  a semiconductor surface layer including majority carrier dopants of a first conductivity type, and
  a buried layer including majority carrier dopants of a second conductivity type;
 a metallization structure extending over the semiconductor surface layer;
 an isolation structure, including:
  a first trench extending through the semiconductor structure to the buried layer,
  a first dielectric liner extending along a sidewall of the first trench from the semiconductor surface layer to the buried layer,
  a first polysilicon including majority carrier dopants of the first conductivity type, the first polysilicon extending inside the first dielectric liner and filling the first trench to a top side of the semiconductor surface layer, a first deep doped region including majority carrier dopants of the second conductivity type, the first deep doped region surrounding the first trench and extending from the semiconductor surface layer to the buried layer, and first conductive features of the metallization structure that connect the first polysilicon to the first deep doped region; and a capacitor, including:

a second trench extending through the semiconductor structure to the buried layer, a second dielectric liner extending along a sidewall of the second trench from the semiconductor surface layer to the buried layer;

a second polysilicon including majority carrier dopants of the first conductivity type, the second polysilicon extending inside the second dielectric liner and filling the second trench to a top side of the semiconductor surface layer, a second deep doped region including majority carrier dopants of the second conductivity type, the second deep doped region surrounding the second trench and extending from the semiconductor surface layer to the buried layer, second conductive features of the metallization structure connected to the second polysilicon to form a first capacitor plate, and further conductive features of the metallization structure connected to the second deep doped region to form a second capacitor plate;

wherein the first trench has a first depth, wherein the second trench has a second depth, and wherein the first depth is greater than the second depth.

2. The semiconductor device of claim 1, wherein the first trench has a first width, wherein the second trench has a second width, and wherein the first width is greater than the second width.

3. The semiconductor device of claim 1, wherein the first dielectric liner includes:

a first oxide layer extending along the sidewall of the first trench from the semiconductor surface layer to the buried layer, a first nitride layer extending along the first oxide layer from the semiconductor surface layer to the buried layer, and a second oxide layer extending along the first nitride layer from the semiconductor surface layer to the buried layer; and wherein the second dielectric liner includes:

a third oxide layer extending along the sidewall of the second trench from the semiconductor surface layer to the buried layer, a second nitride layer extending along the third oxide layer from the semiconductor surface layer to the buried layer, and a fourth oxide layer extending along the second nitride layer from the semiconductor surface layer to the buried layer.

4. The semiconductor device of claim 1, wherein the capacitor comprises:

a plurality of second trenches extending through the semiconductor structure to the buried layer, each of the second trenches surrounded by the second deep doped region and including:

a corresponding second dielectric liner extending along a sidewall of the second trench from the semiconductor surface layer to the buried layer, and a corresponding second polysilicon including majority carrier dopants of the first conductivity type, the second polysilicon extending inside the second dielectric liner and filling the second trench to the top side of the semiconductor surface layer.

5. The semiconductor device of claim 4, wherein the capacitor further comprises a shallow implant region having majority carrier dopants of the second conductivity type and extending in the semiconductor surface layer between the plurality of second trenches within the second deep doped region.

6. The semiconductor device of claim 1, wherein the first dielectric liner includes:

a first oxide layer extending along the sidewall of the first trench from the semiconductor surface layer to the buried layer;

a nitride layer extending along the first oxide layer from the semiconductor surface layer to the buried layer; and a second oxide layer extending along the nitride layer from the semiconductor surface layer to the buried layer.

7. The semiconductor device of claim 1, further comprising a shallow implant region having majority carrier dopants of the second conductivity type and extending in the semiconductor surface layer along a side of the first trench within the first deep doped region.

8. A semiconductor device, comprising:

a semiconductor surface layer with majority carrier dopants of a first conductivity type;

a buried layer with majority carrier dopants of a second conductivity type;

a first trench extending through the semiconductor surface layer to the buried layer;

a second trench extending through the semiconductor surface layer to the buried layer;

a first deep doped region surrounding the first trench and extending from the semiconductor surface layer to the buried layer;

a second deep doped region surrounding the second trench and extending from the semiconductor surface layer to the buried layer;

a first dielectric liner on a sidewall of the first trench and a second dielectric liner on a sidewall of the second trench;

a first polysilicon in the first trench and a second polysilicon in the second trench;

first conductive features of a metallization structure extending over the semiconductor surface layer that connect the first polysilicon to the first deep doped region; and second conductive features of the metallization structure that connect to the second polysilicon;

wherein the first trench has a first depth, wherein the second trench has a second depth, and wherein the first depth is greater than the second depth.

9. The semiconductor device of claim 8, wherein the first and second dielectric liners comprise:
a first oxide layer;
a nitride layer on the first oxide layer; and
a second oxide layer on the nitride layer.

10. The semiconductor device of claim 8, further comprising a shallow implant region extending along a side of the first trench within the first deep doped region.

11. The semiconductor device of claim 8, wherein the first trench has a first width, wherein the second trench has a second width, and wherein the first width is greater than the second width.

12. A semiconductor device, comprising:
a semiconductor structure, including:
a semiconductor surface layer of a first conductivity type, and
a buried layer a second conductivity type;
a metallization structure extending over the semiconductor surface layer;
an isolation structure, including:
a first trench extending through the semiconductor structure to the buried layer,
a first dielectric liner extending along a sidewall of the first trench from the semiconductor surface layer to the buried layer,
a first polysilicon of the first conductivity type, the first polysilicon extending inside the first dielectric liner and filling the first trench to a top side of the semiconductor surface layer,
a first deep doped region of the second conductivity type, the first deep doped region surrounding the first trench and extending from the semiconductor surface layer to the buried layer, and
first conductive features of the metallization structure that connect the first polysilicon to the first deep doped region; and
a capacitor, including:
a second trench extending through the semiconductor structure to the buried layer,
a second dielectric liner extending along a sidewall of the second trench from the semiconductor surface layer to the buried layer,
a second polysilicon of the first conductivity type, the second polysilicon extending inside the second dielectric liner and filling the second trench to a top side of the semiconductor surface layer,
a second deep doped region of the second conductivity type, the second deep doped region surrounding the second trench and extending from the semiconductor surface layer to the buried layer,
second conductive features of the metallization structure connected to the second polysilicon to form a first capacitor plate, and
further conductive features of the metallization structure connected to the second deep doped region to form a second capacitor plate.

13. The semiconductor device of claim 12, wherein the first trench has a first depth, wherein the second trench has a second depth, and wherein the first depth is greater than the second depth.

14. The semiconductor device of claim 12, wherein the first trench has a first width, wherein the second trench has a second width, and wherein the first width is greater than the second width.

15. The semiconductor device of claim 12, wherein:
the first dielectric liner includes:
a first oxide layer extending along the sidewall of the first trench from the semiconductor surface layer to the buried layer,
a first nitride layer extending along the first oxide layer from the semiconductor surface layer to the buried layer, and
a second oxide layer extending along the first nitride layer from the semiconductor surface layer to the buried layer; and
the second dielectric liner includes:
a third oxide layer extending along the sidewall of the second trench from the semiconductor surface layer to the buried layer,
a second nitride layer extending along the third oxide layer from the semiconductor surface layer to the buried layer, and
a fourth oxide layer extending along the second nitride layer from the semiconductor surface layer to the buried layer.

16. The semiconductor device of claim 12, wherein the capacitor comprises:
a plurality of second trenches extending through the semiconductor structure to the buried layer, each of the second trenches surrounded by the second deep doped region and including:
a corresponding second dielectric liner extending along a sidewall of the second trench from the semiconductor surface layer to the buried layer, and
a corresponding second polysilicon including majority carrier dopants of the first conductivity type, the second polysilicon extending inside the second dielectric liner and filling the second trench to the top side of the semiconductor surface layer.

17. The semiconductor device of claim 8, wherein the first trench is part of an isolation structure and the second trench is part of a capacitor.

* * * * *